(12) United States Patent
Dakshina-Murthy et al.

(10) Patent No.: US 6,855,582 B1
(45) Date of Patent: Feb. 15, 2005

(54) FINFET GATE FORMATION USING REVERSE TRIM AND OXIDE POLISH

(75) Inventors: Srikanteswara Dakshina-Murthy, Wappingers Falls, NY (US); Cyrus E. Tabery, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/459,589

(22) Filed: Jun. 12, 2003

(51) Int. Cl.$^7$ .............................................. H01L 21/00
(52) U.S. Cl. ..................................... 438/157; 257/618
(58) Field of Search ............................... 438/157–158, 438/154, 176, 199, 206, 212, 283; 257/327, 329, 331, 619

(56) References Cited

U.S. PATENT DOCUMENTS

| | | | |
|---|---|---|---|
| 5,801,397 A | 9/1998 | Cunningham | 257/66 |
| 5,960,270 A | 9/1999 | Misra et al. | 438/197 |
| 6,265,256 B1 | 7/2001 | An et al. | 438/201 |
| 6,303,447 B1 | 10/2001 | Chhagan et al. | 438/299 |
| 6,342,410 B1 | 1/2002 | Yu | 438/164 |
| 6,396,108 B1 | 5/2002 | Krivokapic et al. | 257/365 |
| 6,406,951 B1 | 6/2002 | Yu | 438/183 |
| 6,413,802 B1 | 7/2002 | Hu et al. | 438/151 |
| 6,458,662 B1 | 10/2002 | Yu | 438/286 |
| 6,475,890 B1 | 11/2002 | Yu | 438/574 |
| 6,515,320 B1 | 2/2003 | Azuma et al. | 257/288 |
| 6,525,403 B2 * | 2/2003 | Inaba et al. | 257/618 |
| 6,551,885 B1 | 4/2003 | Yu | 438/300 |
| 6,551,886 B1 | 4/2003 | Yu | 438/300 |
| 6,562,665 B1 | 5/2003 | Yu | 438/149 |
| 6,583,469 B1 | 6/2003 | Fried et al. | 257/329 |
| 2003/0111686 A1 | 6/2003 | Nowak | |
| 2003/0113970 A1 | 6/2003 | Fried et al. | |
| 2003/0141525 A1 | 7/2003 | Nowak | |
| 2003/0151077 A1 | 8/2003 | Mathew et al. | |

FOREIGN PATENT DOCUMENTS

WO    WO 03/015182 A2    2/2003

OTHER PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48 No. 5, May 2001, pp. 880–886.

Xuejue Huang et al., "Sub 50–nm FinFET: PMOS," 1999 IEEE, IEDM, pp. 67–70.

(List continued on next page.)

Primary Examiner—David Nelms
Assistant Examiner—David Vu
(74) Attorney, Agent, or Firm—Harrity & Snyder, LLP

(57) ABSTRACT

A method of forming a gate electrode for a fin field effect transistor (FinFET) is provided. The method includes forming a fin on a substrate and forming an oxide layer over the fin. The method further includes forming a trench in the oxide layer, the trench crossing over the fin, and filling the trench with a material to form a gate electrode.

19 Claims, 28 Drawing Sheets

CROSS
SECTIONAL
VIEW

OTHER PUBLICATIONS

Yang–Kyu Choi et al., "Nanoscale CMOS Spacer FinFET for the Terabit Era," IEEE Electron Device Letters, vol. 23, No. 1, Jan. 2002, pp. 25–27.

Copy of co–pending application Ser. No. 10/310,777; entitled "Damascene Gate Process with Sacrifical Oxide in Semiconductor Devices"; filed on Dec. 6, 2002; 29 pages.

Copy of co–pending application Ser. No. 10/645,577; entitled Sacrificial Oxide Protection During Dummy Gate Removal in Damascene Gate Proces in Semiconductor Devices; filed on Aug. 22, 2003; 28 pages.

Copy of co–pending application Ser. No. 10/320,536; entitled "FinFET Gate Formation Using Reverse Trim of Dummy Gate"; filed on Dec. 17, 2002; 25 pages.

Copy of co–pending application Ser. No. 10/720,166, entitled "Damascene Gate Process with Sacrificial Oxide in Semiconductor Devices" and Preliminary Amendment filed in 10/720,166 on Nov. 25, 2003; 41 pages.

Copy of U.S. Ser. No. 10/754,559; filed Jan. 12, 2004; entitled: "Damascene Tri–Gate FinFET"; 28 pages.

Stephen H. Tang et al., "Comparison of Short–Channel Effect and Offstate Leakage in Symmetric vs. Asymmetric Double Gate MOSFETs", IEEE International SOI Conference, Oct. 2000, pp. 120–121.

United States Patent Application Publication No. US2002/0153587; publication date Oct. 24, 2002; Adkisson et al.

\* cited by examiner

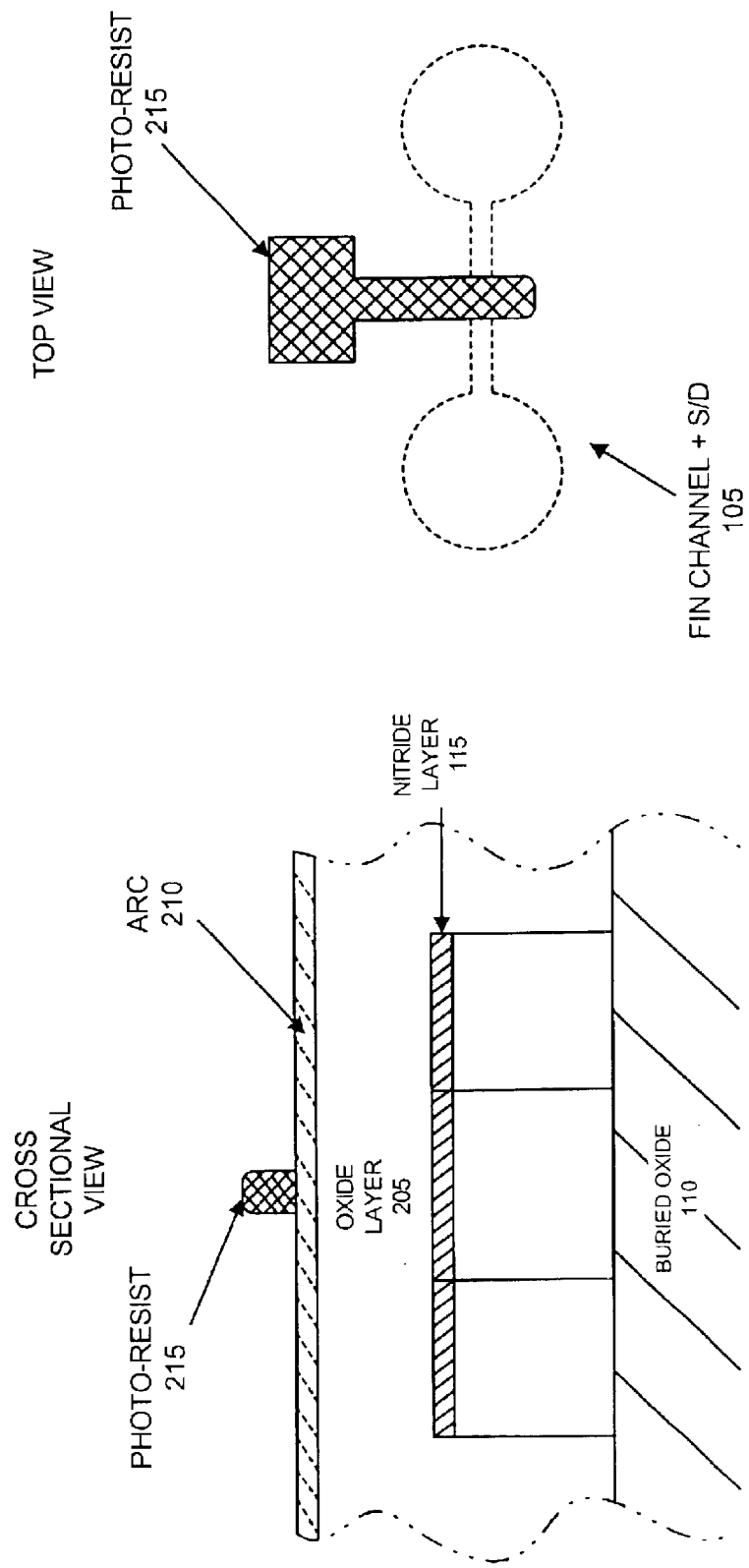

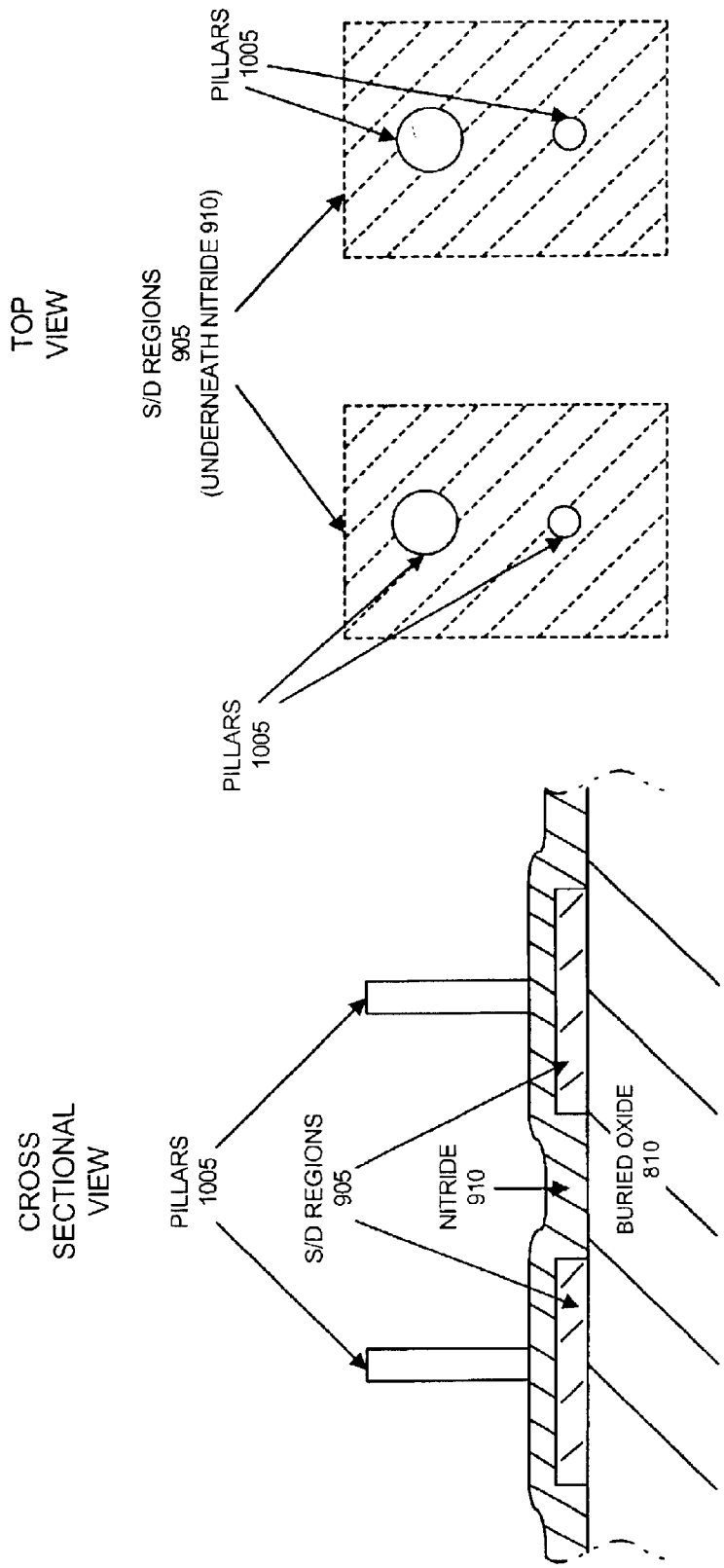

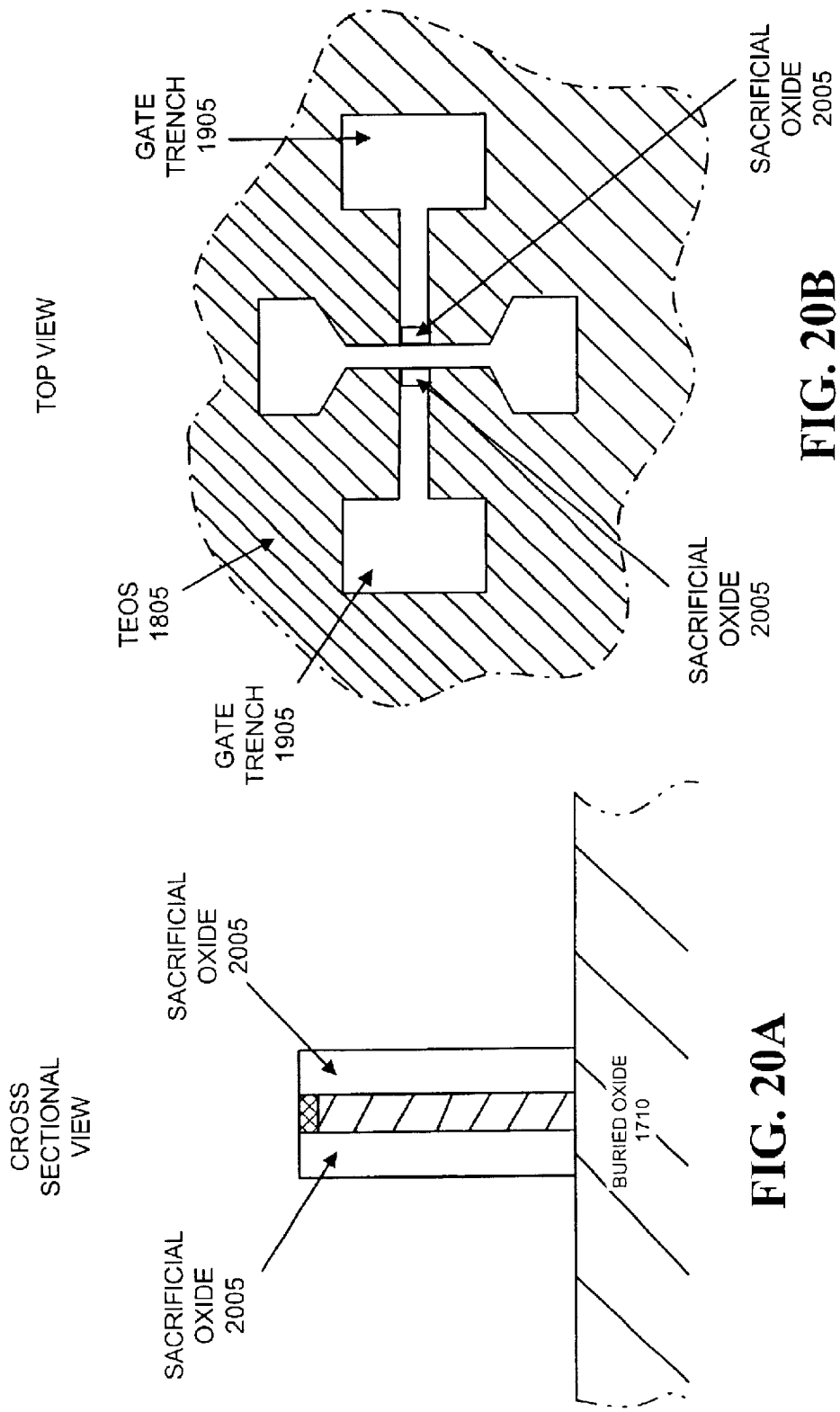

FINFET GATE FORMATION USING REVERSE TRIM AND OXIDE POLISH

TECHNICAL FIELD

The present invention relates generally to transistors and, more particularly, to fin field effect transistors (FinFETs).

BACKGROUND ART

Scaling of device dimensions has been a primary factor driving improvements in integrated circuit performance and reduction in integrated circuit cost. Due to limitations associated with existing gate-oxide thicknesses and source/drain (S/D) junction depths, scaling of existing bulk MOSFET devices below the 0.1 µm process generation may be difficult, if not impossible. New device structures and new materials, thus, are likely to be needed to improve FET performance.

Double-gate MOSFETs represent new devices that are candidates for succeeding existing planar MOSFETs. In double-gate MOSFETs, the use of two gates to control the channel significantly suppresses short-channel effects. A FinFET is one example of a recent double-gate structure that includes a channel formed in a vertical fin. The FinFET is similar to existing planar MOSFETS in layout and fabrication. The FinFET also provides a range of channel lengths, CMOS compatibility and large packing density compared to other double-gate structures.

Existing FinFET structures have relatively severe topographies. The severe topography associated with the FinFET structure has conventionally limited the ability to print and pattern small features for the FinFET gate. Therefore, there exists a need for methods for forming a gate of a FinFET that permits a wide photo margin, thus, increasing the ability to print and pattern the small features of the FinFET gate.

DISCLOSURE OF THE INVENTION

Consistent with the present invention, a method of forming a gate of a FinFET transistor is provided that permits a wide photo margin. Consistent with the invention, a reverse trim process may be employed for forming a gate within a layer of material, such as, for example, an oxide layer. The gate may be formed within the oxide layer by applying a photo-resist material in a pattern, corresponding to a shape of the gate, to the oxide layer. A layer of the oxide layer may then be etched away to produce a raised portion of the oxide layer in the shape of the pattern of the photo-resist material. A nitride layer may then be applied to the exposed surface of the oxide layer. The nitride layer, formed on the raised portion of the oxide layer, and the upper part of the raised portion of the oxide layer may be polished off to expose a portion of the oxide layer in the shape of the pattern of the photo-resist material. The exposed oxide may be etched, selective to nitride and the material of the fin, to create a trench that is approximately transverse to the underlying fin. The gate electrode may be then formed within the created trench. Formation of the gate electrode, consistent with the invention, permits a wide photo margin, thus, increasing the ability to print and pattern the small features of the FinFET gate.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a fin field effect transistor (FinFET). The FinFET includes a fin that further includes a first material. The FinFET further includes an oxide layer formed over the fin, a trench being formed in the oxide layer transverse to the fin. The FinFET also includes a gate electrode that includes a second material formed in the trench.

According to the present invention, the foregoing and other advantages are achieved in part by a a method of forming a gate electrode for a fin field effect transistor (FinFET). The method includes forming a fin on a substrate and forming an oxide layer over the fin. The method further includes forming a trench in the oxide layer, the trench crossing over the fin, and filling the trench with a material to form a gate electrode.

According to a further aspect of the invention, a method of forming a gate for a fin field effect transistor (FinFET) is provided. The method includes forming an oxide layer over a fin and etching away at least a portion of the oxide layer to form a protrusion above the fin. The method further includes forming a nitride layer over the oxide layer and the protrusion and polishing the nitride layer and the protrusion to expose a top surface of the protrusion. The method also includes etching the protrusion and the oxide layer to form a trench that crosses over the fin and filling the trench with a material to form the gate.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 2A and 2B illustrate an exemplary oxide and anti-reflective coating (ARC) layer formed over a fin consistent with the invention;

FIGS. 10A and 10B illustrate formation of exemplary pillars upon the source and drain regions of FIGS. 9A and 9B consistent with the invention;

FIGS. 20A and 20B illustrate oxidization of an exposed portion of the fin within the trench of FIG. 19 consistent with the invention;

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, a reverse trim process for creating FinFET gates is provided that increases the ability to print and pattern small features of the FinFET gate. The reverse trim process enables formation of trimmed damascene gates that allow wide photo margins.

Figure 1B:
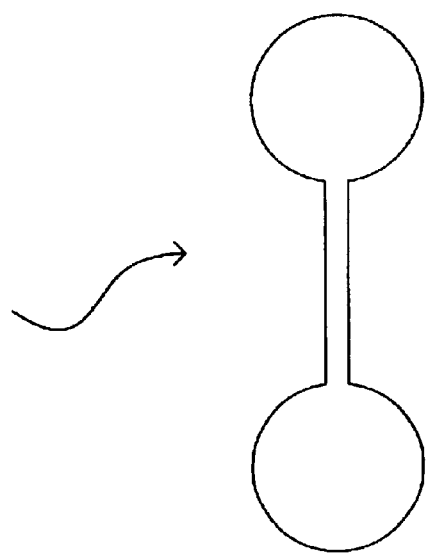
FIGS. 1A and 1B illustrate an exemplary starting substrate and fin for creating a FinFET consistent with the present invention.
Figure 1A:
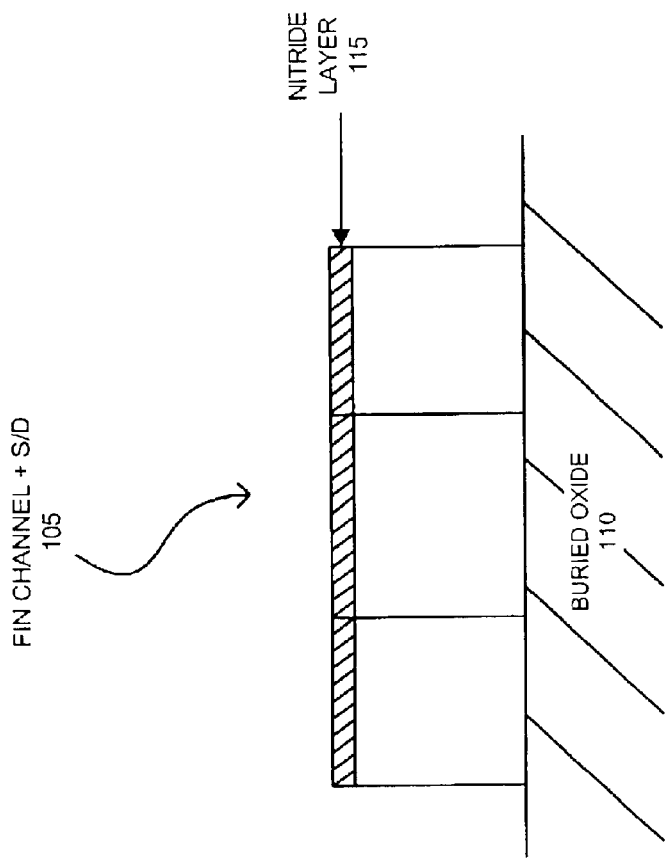

FIGS. 1A and 1B illustrate a FinFET fin channel and source/drain (S/D) 105 formed on a buried oxide layer 110 in accordance with an exemplary embodiment of the present invention. Fin channel and S/D 105 maybe formed on buried oxide layer 110 using any conventional technique. Fin channel and S/D 105 may include, for example, silicon (Si). Other materials, such as Germanium (Ge), may alternatively be used. A layer of material, such as, for example, a nitride layer 115 may be formed upon fin channel and S/D 105. The thickness of layer 115 may range, for example, from about 200 Å to about 600 Å.

As shown in FIGS. 2A and 2B, an oxide layer 205 may be formed over fin channel and S/D 105. Oxide layer 205 may be formed, for example, using conventional deposition processes, followed by subsequent planarization to result in a planar oxide surface. Oxide layer 205 may include any type of oxide material, such as, for example, silicon oxide. The thickness of oxide layer 205 may range, for example, from about 1500 Å to about 3000 Å. The thickness of oxide layer 205 may depend on the height of the already existing fin structure. For example, for a typical fin height of 1000 Å, a planarized oxide thickness of 1500 A may be desirable. However, this planarized thickness may actually require an oxide deposition of 2500 Å, with 1000 Å being lost in the planarization process. After forming oxide layer 205, an anti-reflective coating (ARC) 210 may be applied to oxide layer 205. ARC 210 may be applied, for example, using existing spin-on or CVD techniques. A photo-resist layer 215, patterned in the shape of a desired FinFET gate, may be formed on ARC 210. Photo-resist layer 215 may include any type of existing photo-resist material employed in conventional photolithography. Critical dimensions of photo-resist layer 220 may be reduced using a resist trim etch process, such as, for example, an $O_2/N_2$, $O_2/HBr$, $O_2/Cl_2$ chemistry plasma etching process. This resist trim etching process enables the pattern reversal of small lines to form small spaces in oxide layer 205.

Figure 3:
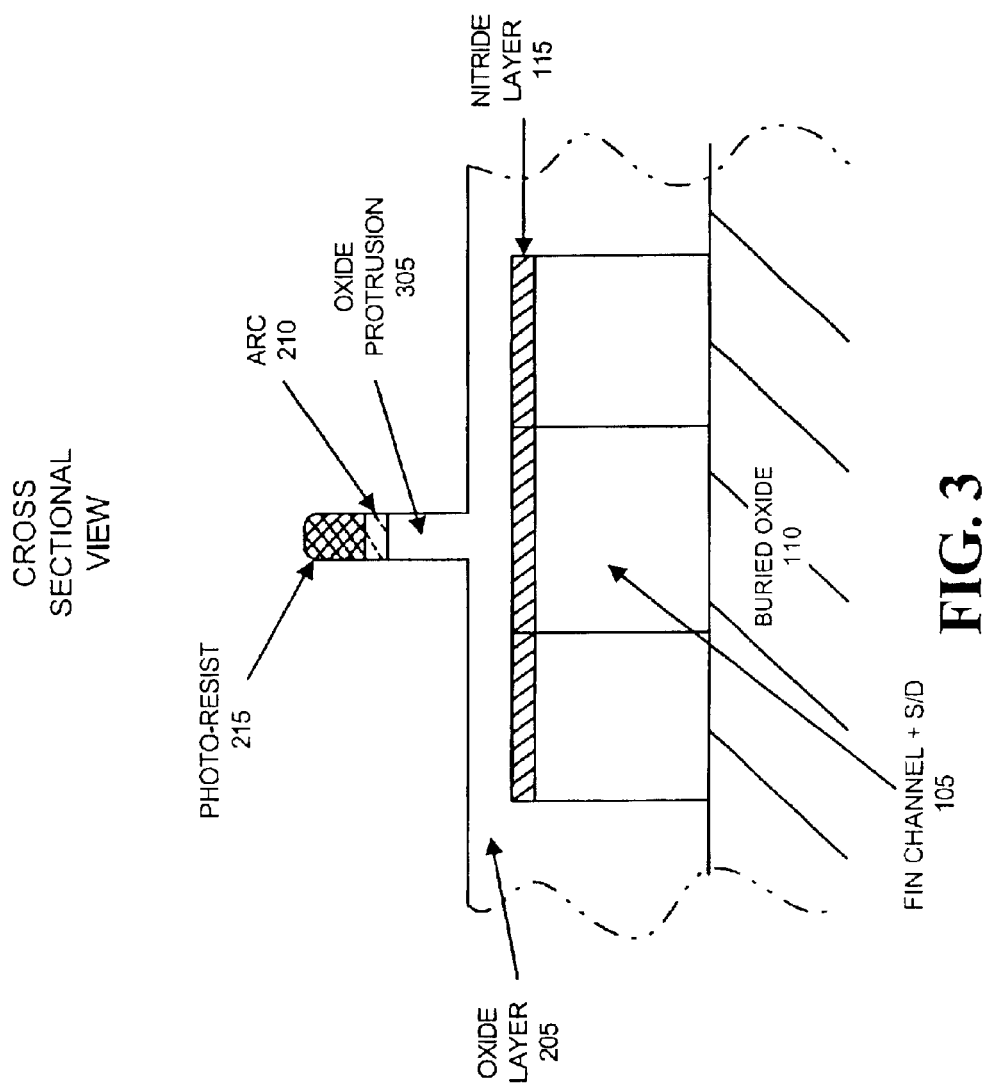
FIG. 3 illustrates a cross sectional view of the removal of a portion of the oxide layer of FIG. 2A consistent with the invention.
Figure 4:
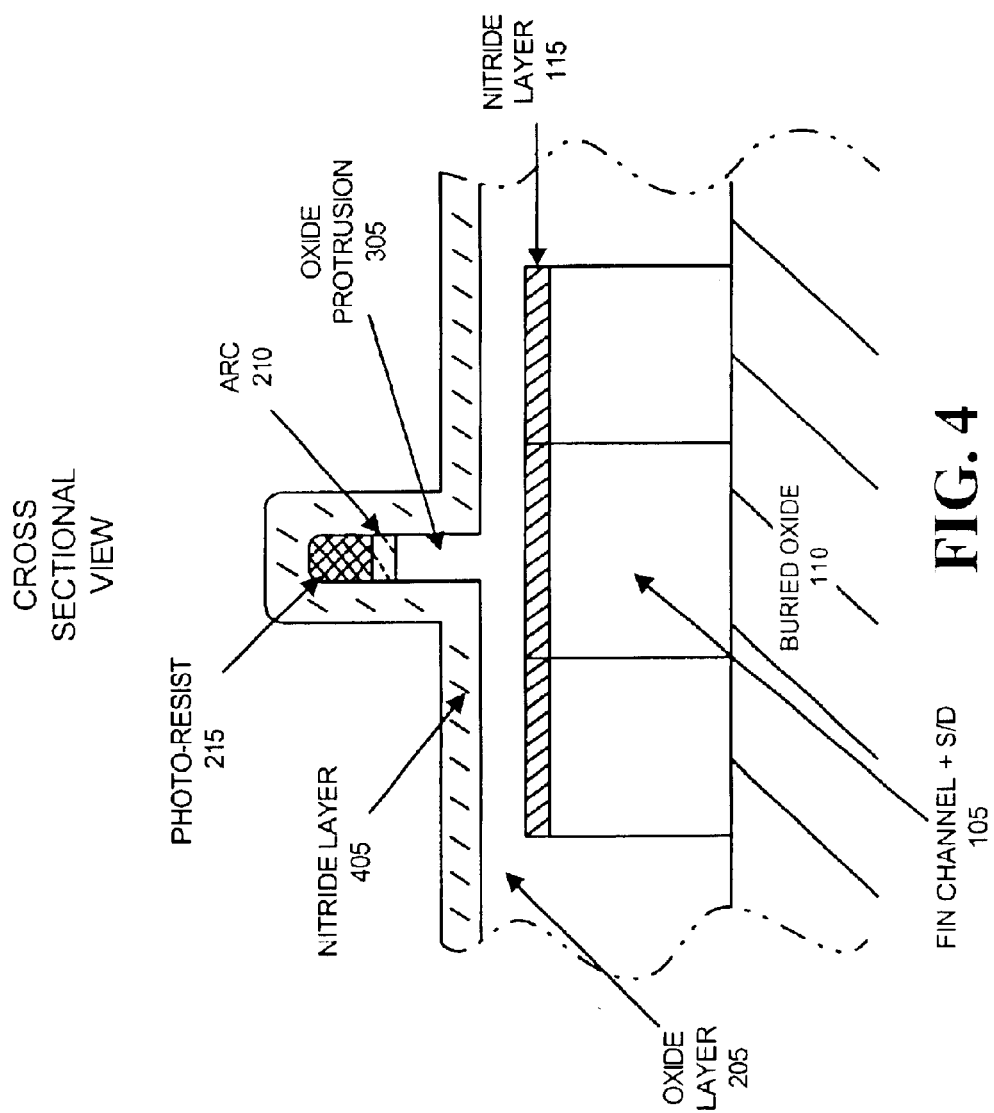
FIG. 4 illustrates a cross sectional view of an exemplary nitride layer formed on the oxide layer of FIG. 3 consistent with the invention.

After formation of oxide layer 205, ARC 210, and photo-resist 215, oxide layer 205 may be etched away to form an oxide protrusion 305 beneath photo-resist 215, as shown in FIG. 3. Conventional techniques may, for example, be employed to etch the desired portion of oxide layer 205. As shown in FIG. 4, a layer of material, such as, for example, a nitride layer 405 may then be formed on oxide layer 205. Nitride layer 405 may be formed using, for example, conventional deposition techniques and may surround oxide protrusion 305, ARC 210 and photo-resist 215. The thickness of nitride layer 405 may range, for example, from about 600 Å to about 1000 Å.

Figure 5:
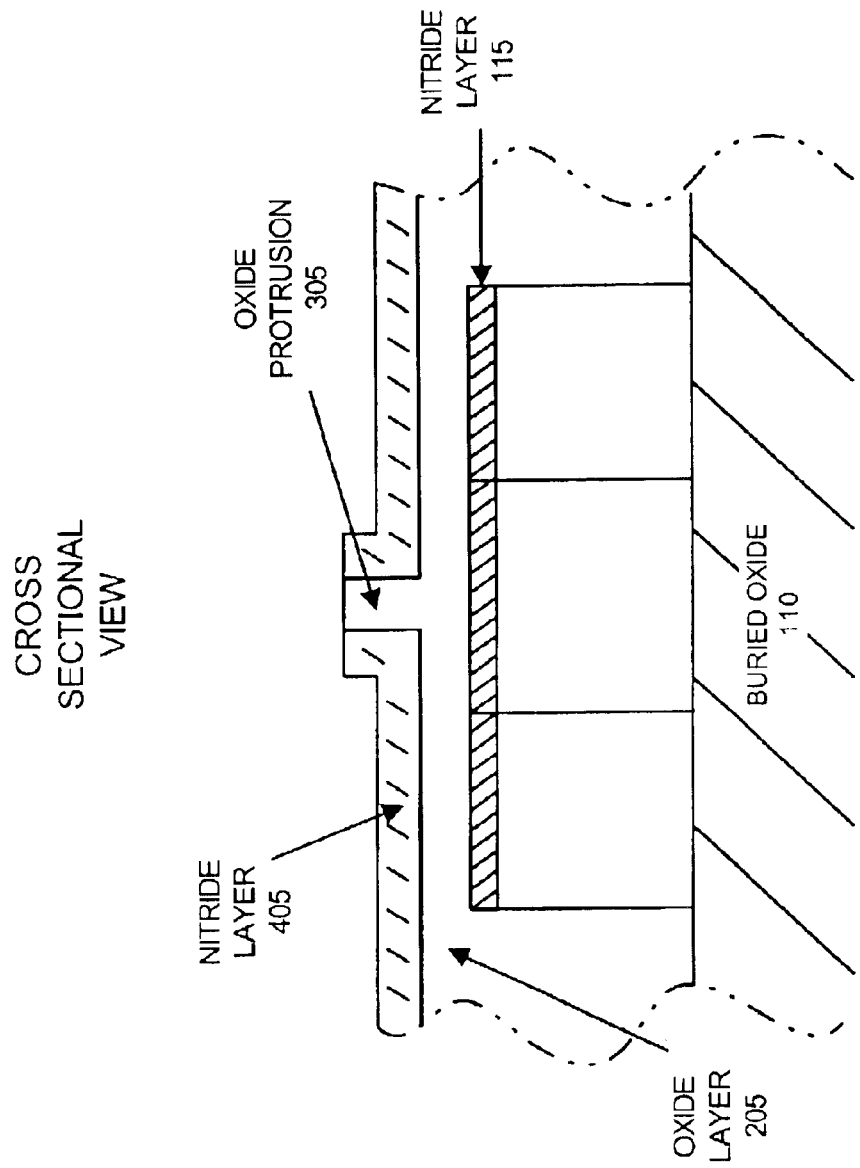
FIG. 5 illustrates a cross-sectional view of the polishing of the exemplary nitride layer of FIG. 4 consistent with the invention.

A portion of oxide protrusion 305 and nitride layer 405 may then be polished away, as shown in FIG. 5. A "buff" type nitride polishing technique, for example, may be used. After buffing, oxide protrusion 305 may extend about 500 Å above oxide layer 205 in the vertical direction.

Figure 6B:
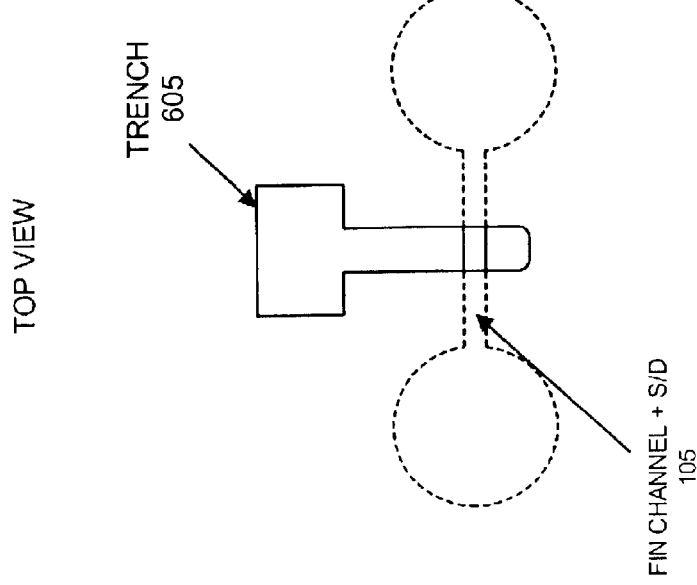
FIGS. 6A and 6B illustrate an exemplary trench etched in the oxide layer of FIG. 5 consistent with the invention.
Figure 6A:
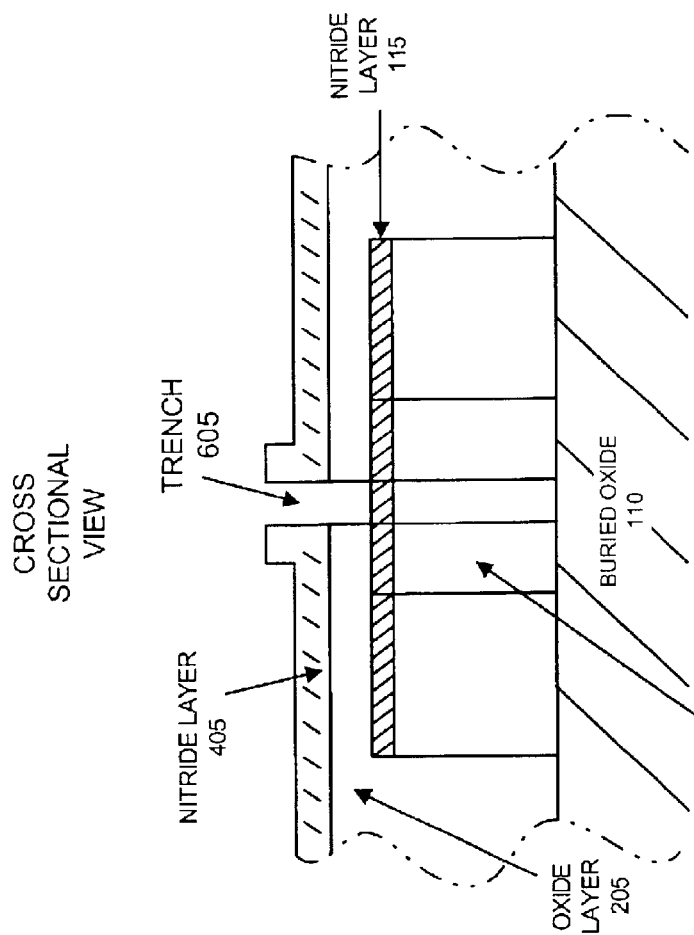

The oxide in oxide protrusion 305, extending down to buried oxide 10, may then be removed to create a trench 605, as shown in FIGS. 6A and 6B. The oxide may be removed using, for example, an oxide etching process that is selective to nitride (i.e., nitride layer 405) and silicon (i.e., fin channel). The oxide etching process may, for example, include a $CHF_3$ rich or $C_4F_8/CO/Ar$ etching process, or the like. The particular flow rates, power ranges, bias voltages, etch duration and other parameters associated with the etching to create trench 605 may be optimized based on the thickness of the layers being etched.

Figure 7B:
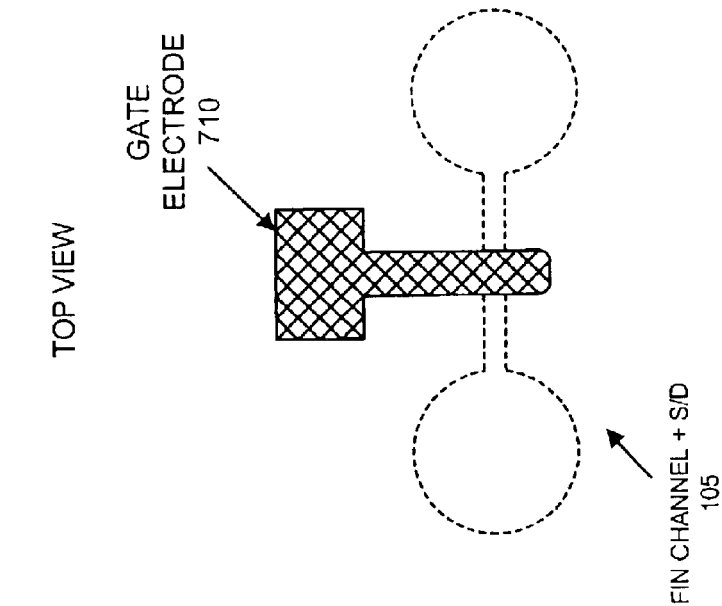
FIGS. 7A, 7B and 7C illustrate the formation of a dielectric and gate electrode in the trench of FIGS. 6A and 6B consistent with the invention.
Figure 7A:
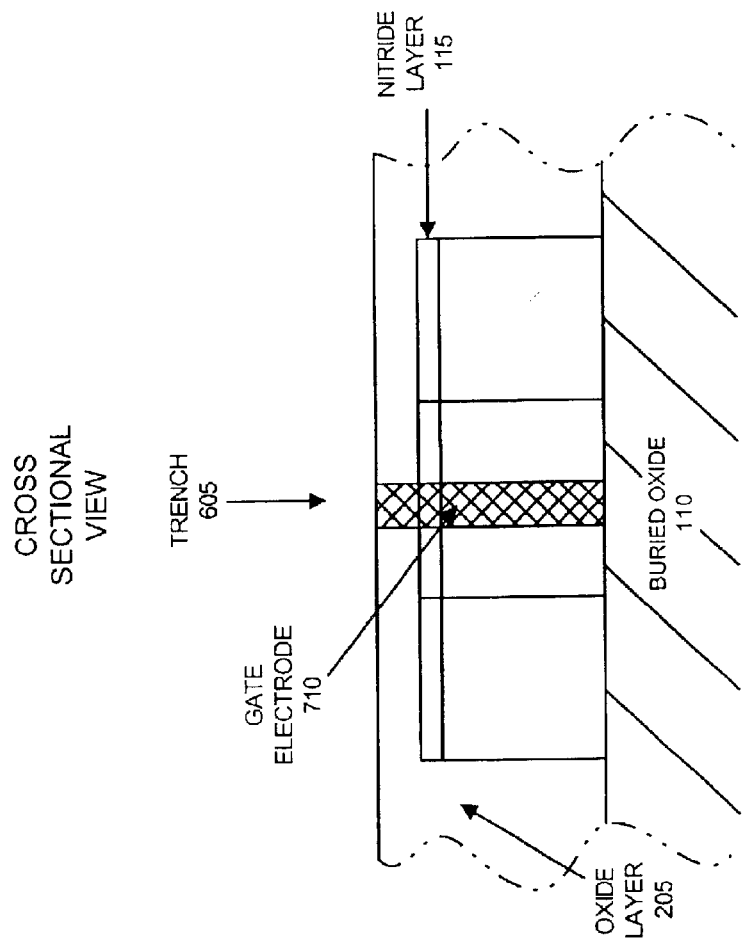
Figure 7C:
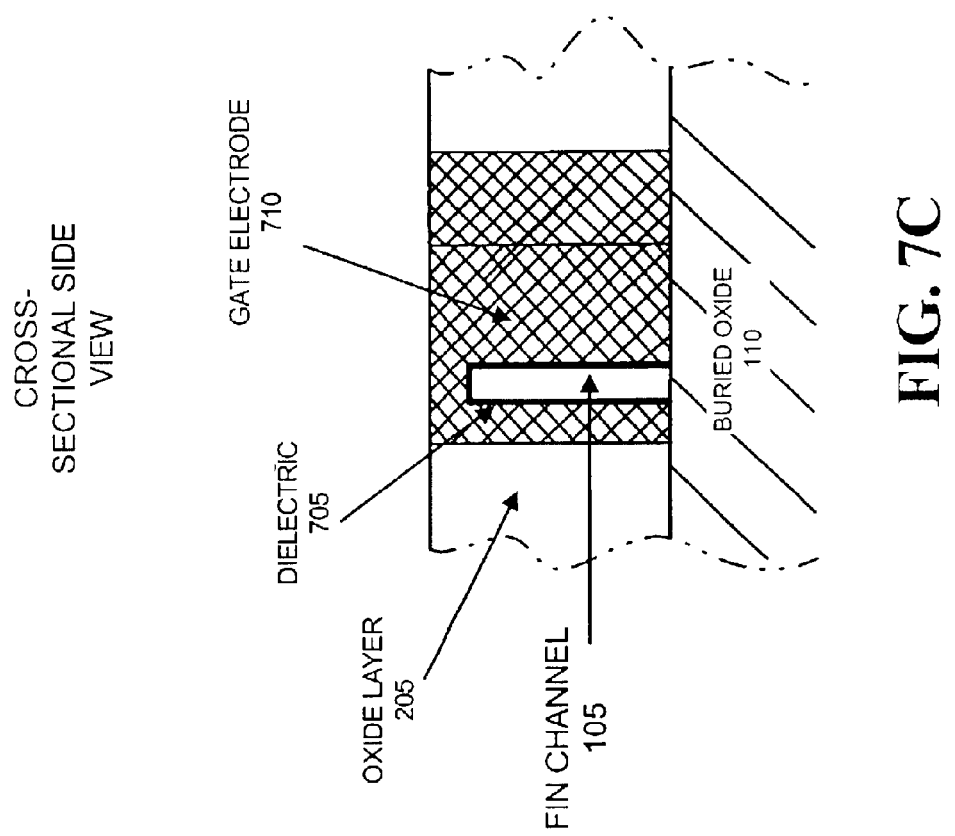

As shown in FIGS. 7A, 7B and 7C, nitride layer 405 may be stripped away from oxide layer 205. A dielectric material 705, such as, for example, an oxide material, may then be formed on the sidewalls of trench 605. Dielectric 705 may be formed on the sidewalls of trench 605 using conventional growth or deposition processes. The thickness of dielectric 705 may range, for example, from about 10 Å to about 50 Å. Gate electrode 710 may then be formed in trench 605 using, for example, conventional deposition processes. Gate electrode 710 may include a material such as, for example, polysilicon, a metal, or a combination. Subsequent to formation of gate electrode 710, the upper exposed surface of gate electrode 710 may be polished to planarize the top surface of gate electrode 710 and to complete the formation of the gate electrode 710 upon the FinFET fin channel. A thin nitride liner may also be formed prior to the formation of gate electrode 710 to protect the fin.

As described above, a reverse trim process for creating FinFET gates is provided that enables formation of trimmed damascene gates. The trimmed damascene gates, consistent with the invention, allow wide photo margins and, thus, improve the ability to print and pattern small features of the FinFET gate.

Exemplary Gate All Around Vertical Transistor with Dummy Channel

In another exemplary embodiment of the invention, a gate all around vertical FinFET transistor may be formed using a dummy channel. The gate all round vertical FinFET transistor, consistent with this exemplary embodiment of the invention, may be formed with excellent control of channel dimensions, such that very small channels may be created.

Figure 8:
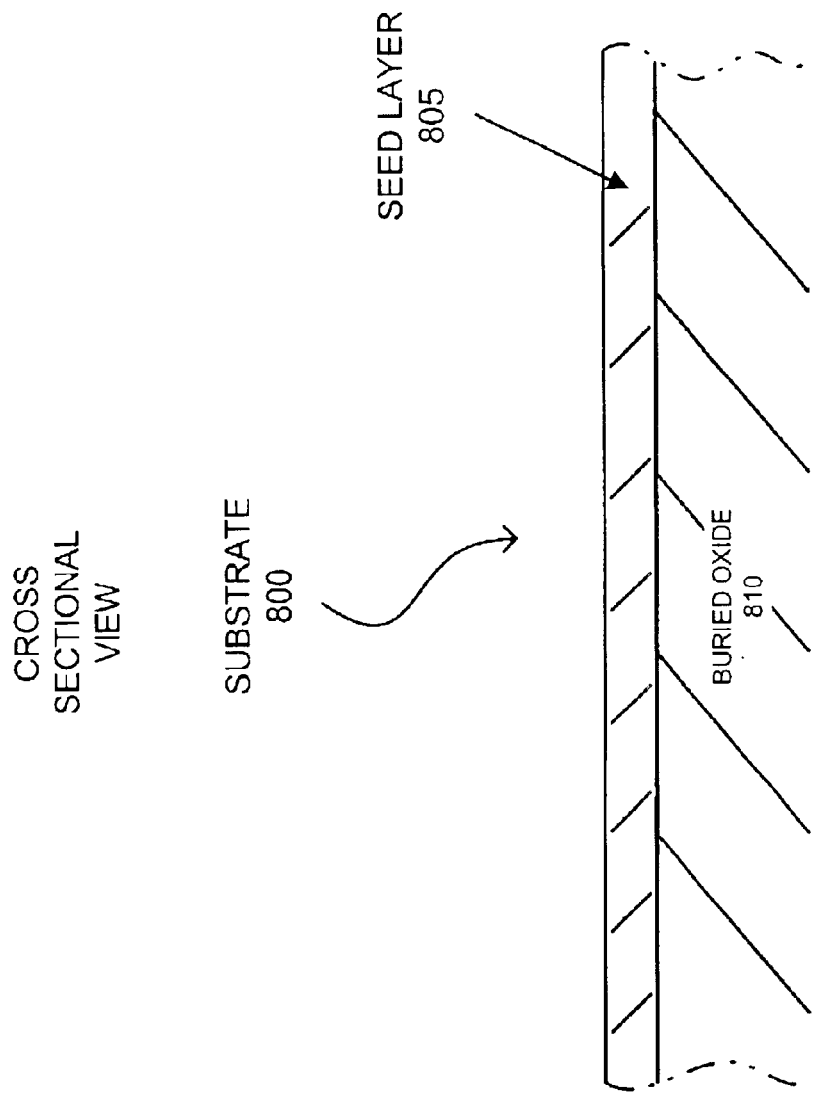
FIG. 8 illustrates a cross-sectional view of an exemplary starting substrate consistent with another exemplary embodiment of the invention.

FIG. 8 illustrates a cross-section of a starting substrate 800 formed in accordance with this exemplary embodiment of the present invention. Substrate 800, consistent with the present invention, may include a silicon on insulator (SOI) structure that includes, for example, a seed layer 805 formed upon, for example, a buried oxide layer 810. Seed layer 805 may, for example, include a thin layer of silicon (Si) material, though other semiconducting materials may be used. The thickness of seed layer 805 may range, for example, from about 100 Å to about 250 Å and the thickness of buried oxide layer 810 may range, for example, from about 1000 Å to about 3000 Å.

Figure 9B:
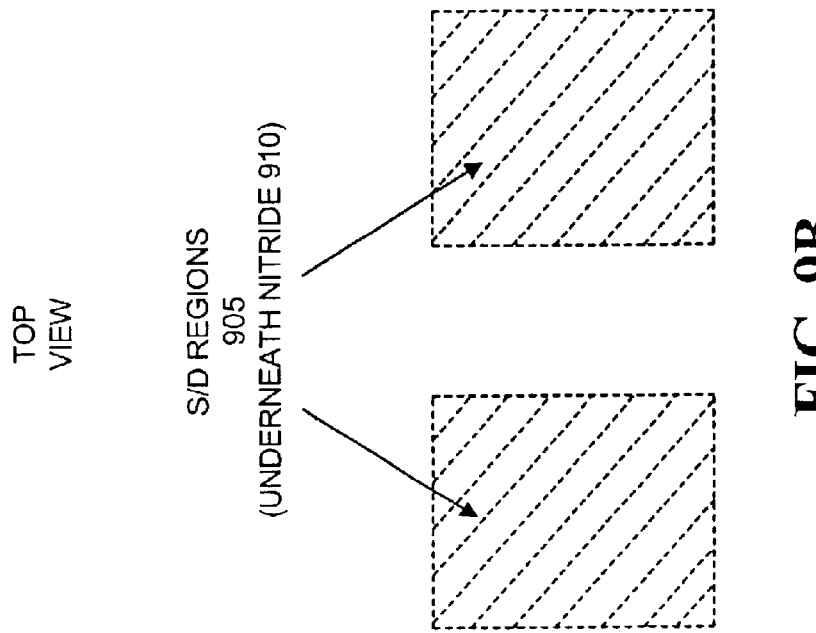
FIGS. 9A and 9B illustrate formation of exemplary source and drain regions upon the starting substrate of FIG. 8 consistent with the invention.
Figure 9A:
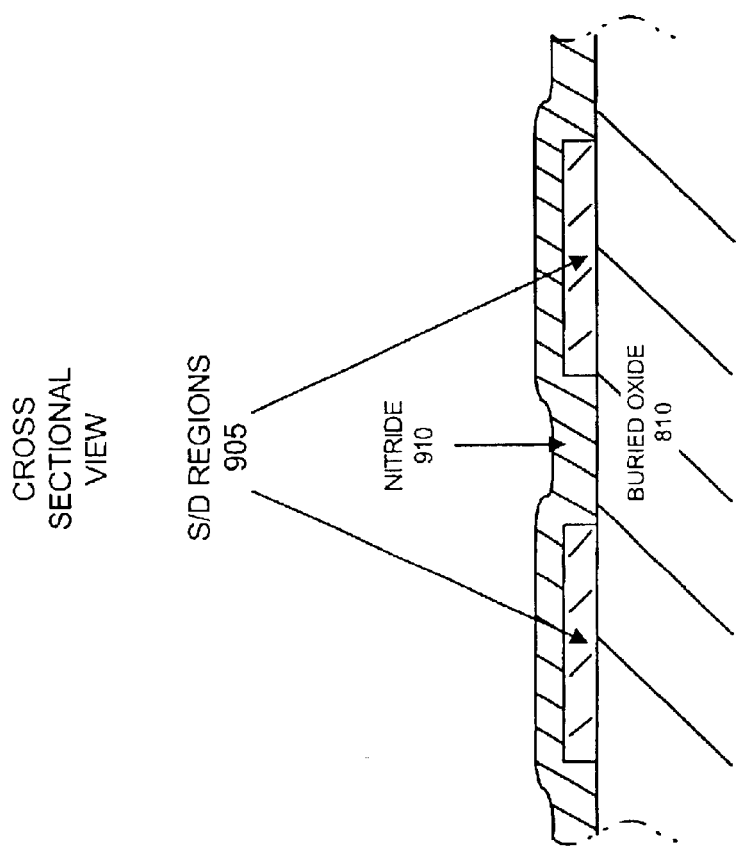

As shown in FIGS. 9A and 9B, after forming, or otherwise obtaining, substrate 800, source and drain (S/D) regions 905 may be defined on buried oxide layer 810. S/D regions 905 may be defined using, for example, existing etching processes. After definition of S/D regions 905, a layer of material, such as, for example, a nitride layer 910, may then be formed on S/D regions 905. Nitride layer 910 may be formed, for example, using existing deposition processes. The thickness of nitride layer 910 may range, for example, from about 100 Å to about 250 Å.

Figure 11:
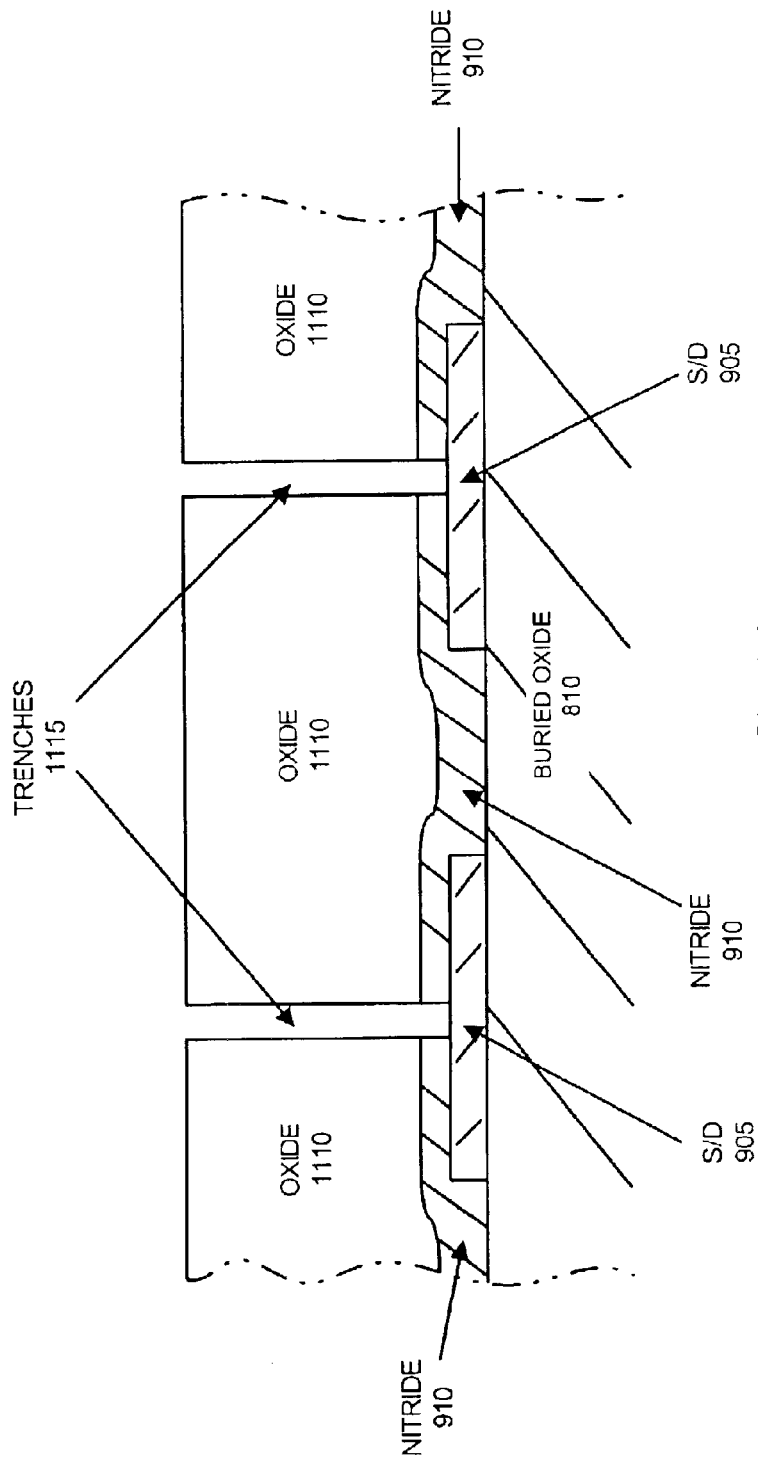
FIG. 11 illustrates a cross-sectional view of the formation of an oxide layer, and removal of the pillars of FIGS. 10A and 10B consistent with the invention.

Pillars 1005 may then be defined on nitride layer 910 and S/D regions 905, as shown in FIGS. 10A and 10B. Pillars 1005 may include, for example, carbon, though other materials may be used. Pillars 1005 may be defined using existing photolithographic processes. As shown in FIG. 11, an oxide layer 1110 may then be formed upon nitride layer 910 between pillars 1005 using, for example, existing deposition and planarization processes. Pillars 1005 may then be removed (e.g., ashed away) to create trenches 1115.

Figure 12B:
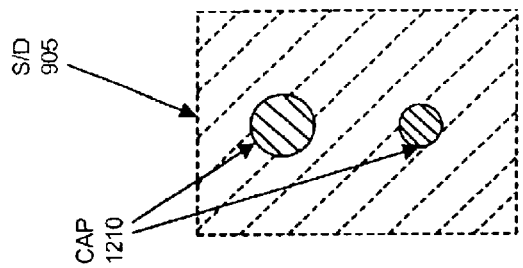
FIGS. 12A and 12B illustrate exemplary pillar regrowth and cap formation consistent with the invention.
Figure 12A:
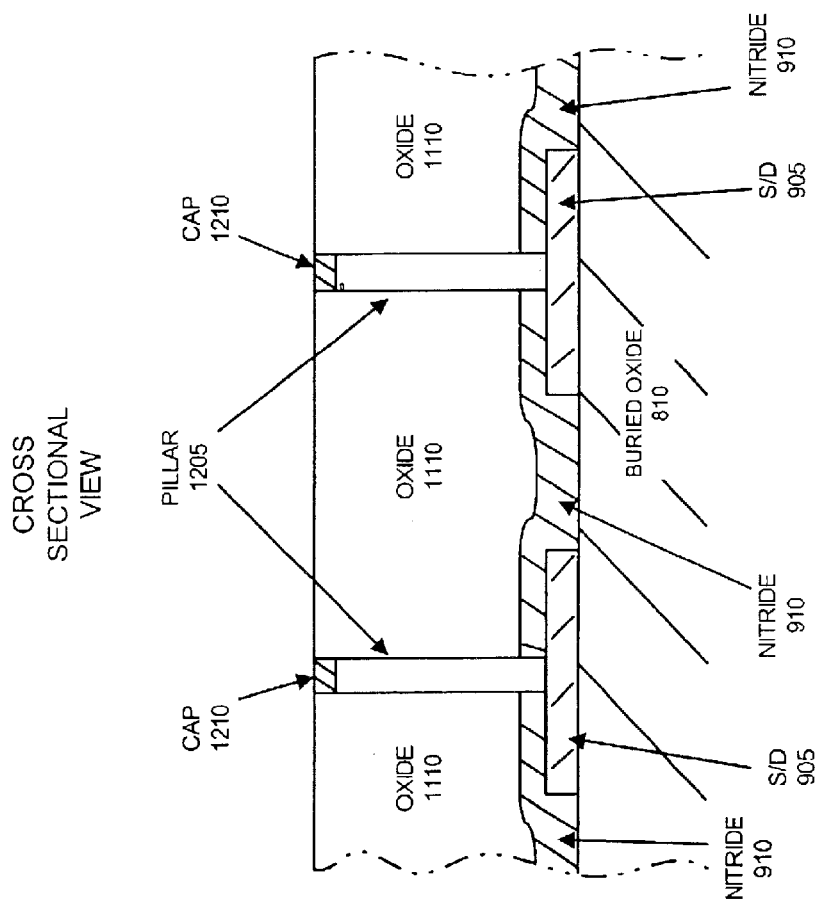

As shown in FIGS. 12A and 12B, pillars 1205 maybe epitaxially re-grown in trenches 1115. Pillars 1205 may be epitaxially re-grown using, for example, silicon, though other semiconducting materials may be used. The smaller of each regrown pillar on each S/D region 905 may serve as the FinFET channel. The larger of each regrown pillar on each S/D region 905 may serve as the low resistance contact to the underlying S/D region 905. Each pillar 1205 may further be recessed and a cap 1210 may be formed in the recess. Cap 1210 may be formed using, for example, conventional deposition processes. Cap 1210 may include, for example, a nitride material.

Figure 13B:
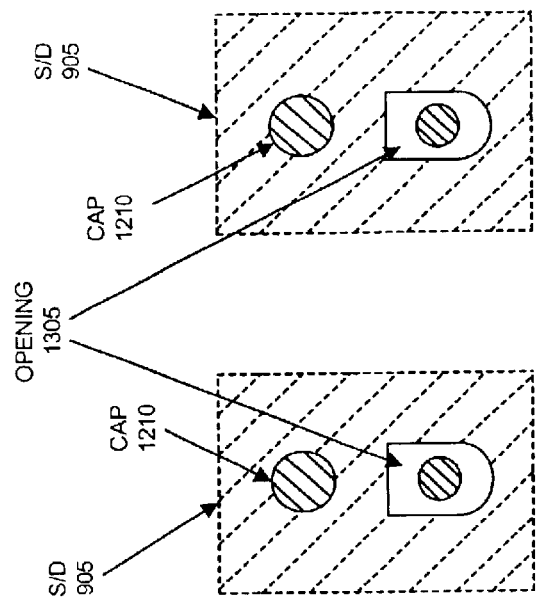
FIGS. 13A and 13B illustrate the exemplary removal of oxide surrounding the smaller of the grown pillars on each source/drain region consistent with the invention.
Figure 13A:
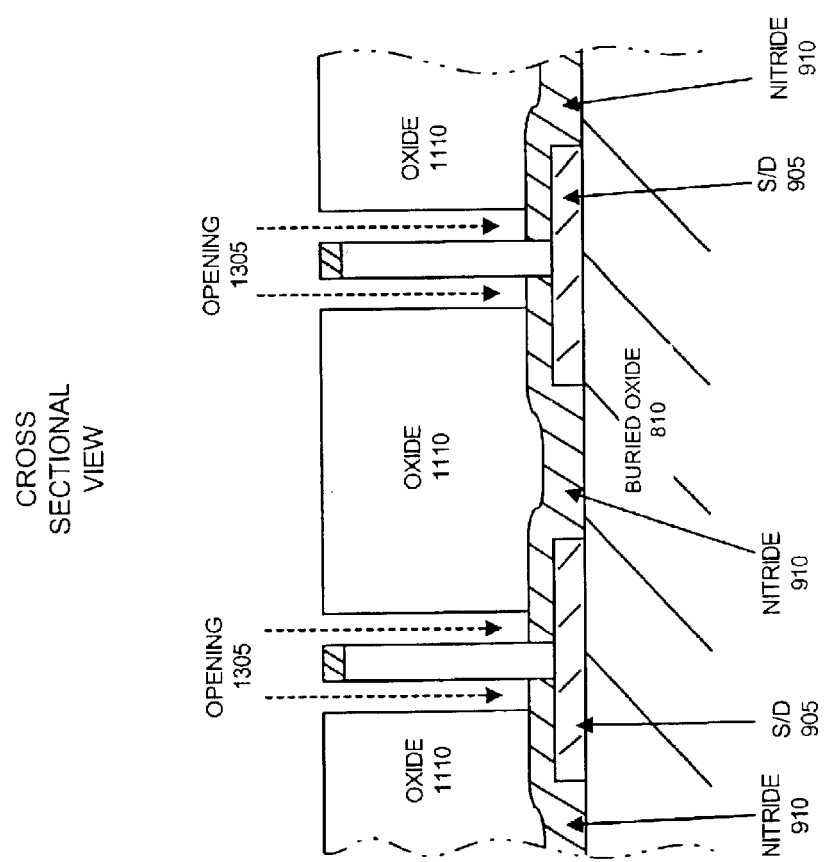
Figures 14A, 14B:
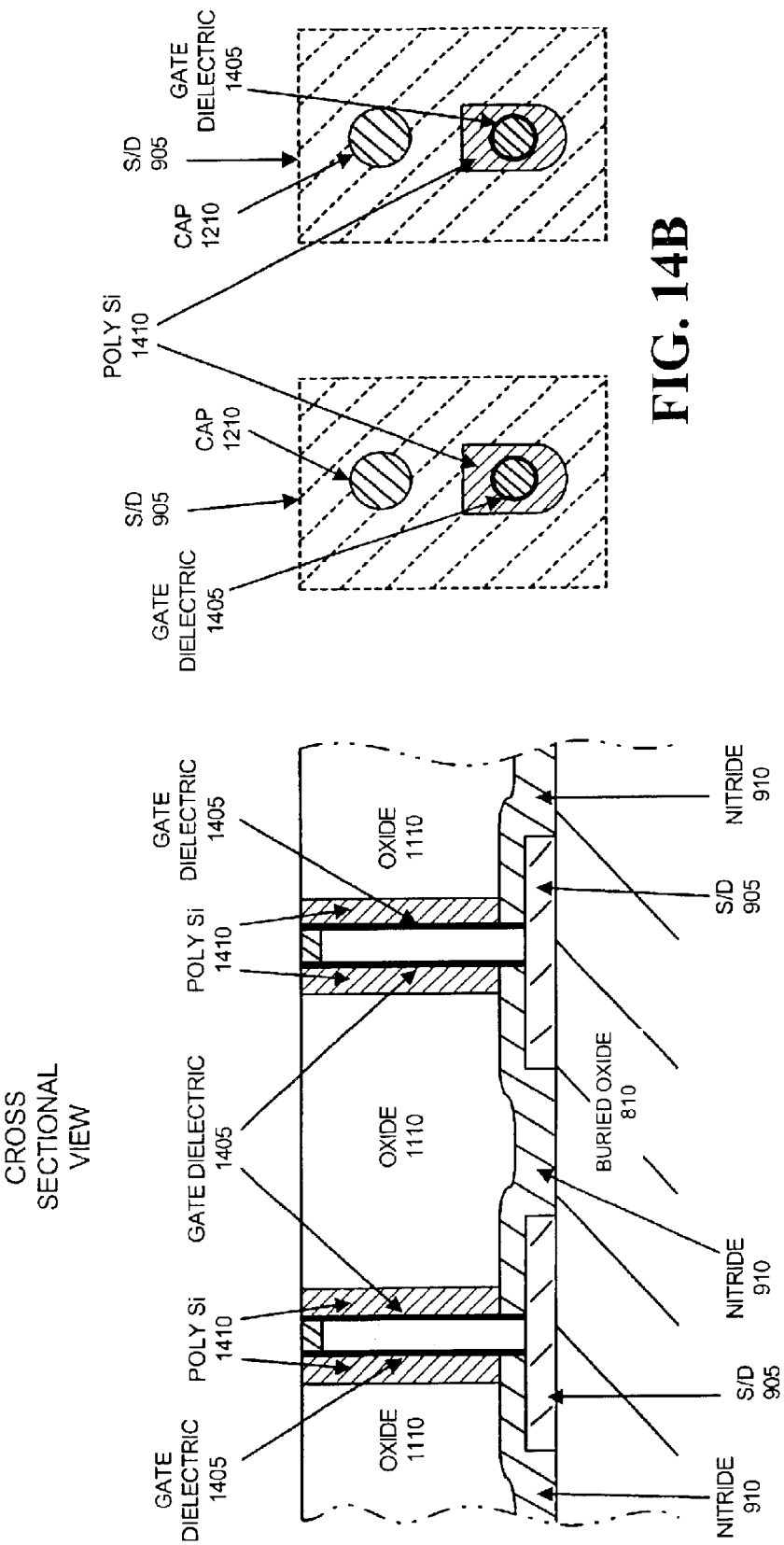
FIGS. 14A and 14B illustrate the exemplary formation of a gate dielectric and polysilicon gate around the smaller of the regrown pillars of FIGS. 13A and 13B consistent with the invention.

After re-growth of pillars 1205, the oxide 1110 surrounding the smaller of the pillars 1205 on each S/D region 905 may be etched down to nitride layer 910 using, for example, an anisotropic nitride etch (e.g., $CHF_3$), to create an opening 1305, as shown in FIGS. 13A and 13B. In the etched area of oxide 1110, a gate dielectric 1405 may be formed on the outer surface of the smaller of the pillars 1205, as shown in FIGS. 14A and 14B. Gate dielectric 1405 may include, for example, an oxide, and may be thermally grown on each of the smaller pillars 1205. The thickness of gate dielectric 1405 may range, for example, from about 10 Å to about 50 Å. Subsequent to formation of gate dielectric 1405, a layer of material, such as, for example, polysilicon 1410 may be formed around gate dielectric 1405 within opening 1305. Polysilicon 1410 may be formed using, for example, existing deposition processes and, subsequent to deposition, may be planarized.

Figure 14C:
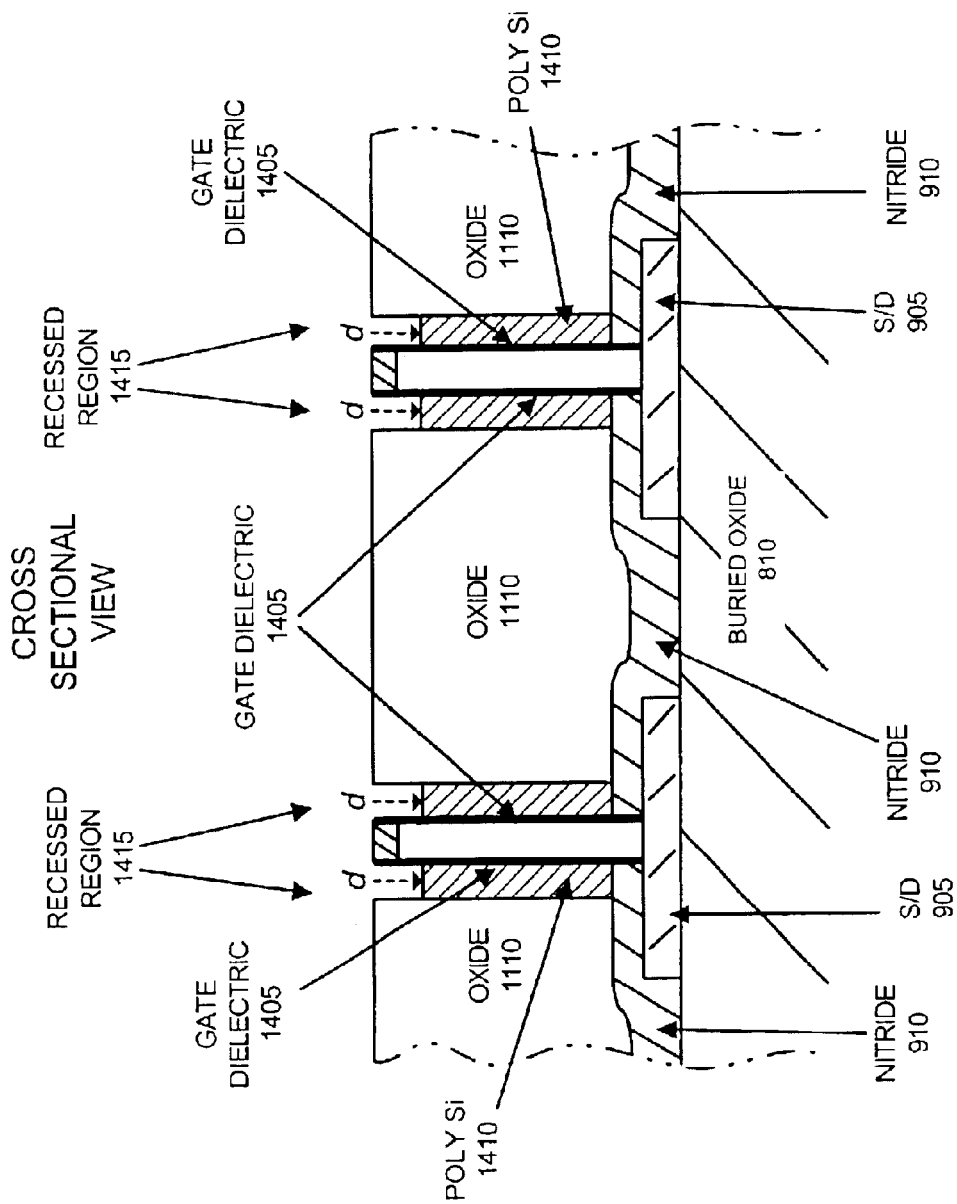
FIG. 14C illustrates the formation of a recessed region in the polysilicon gate of FIGS. 14A and 14B consistent with the invention.
Figure 14D:
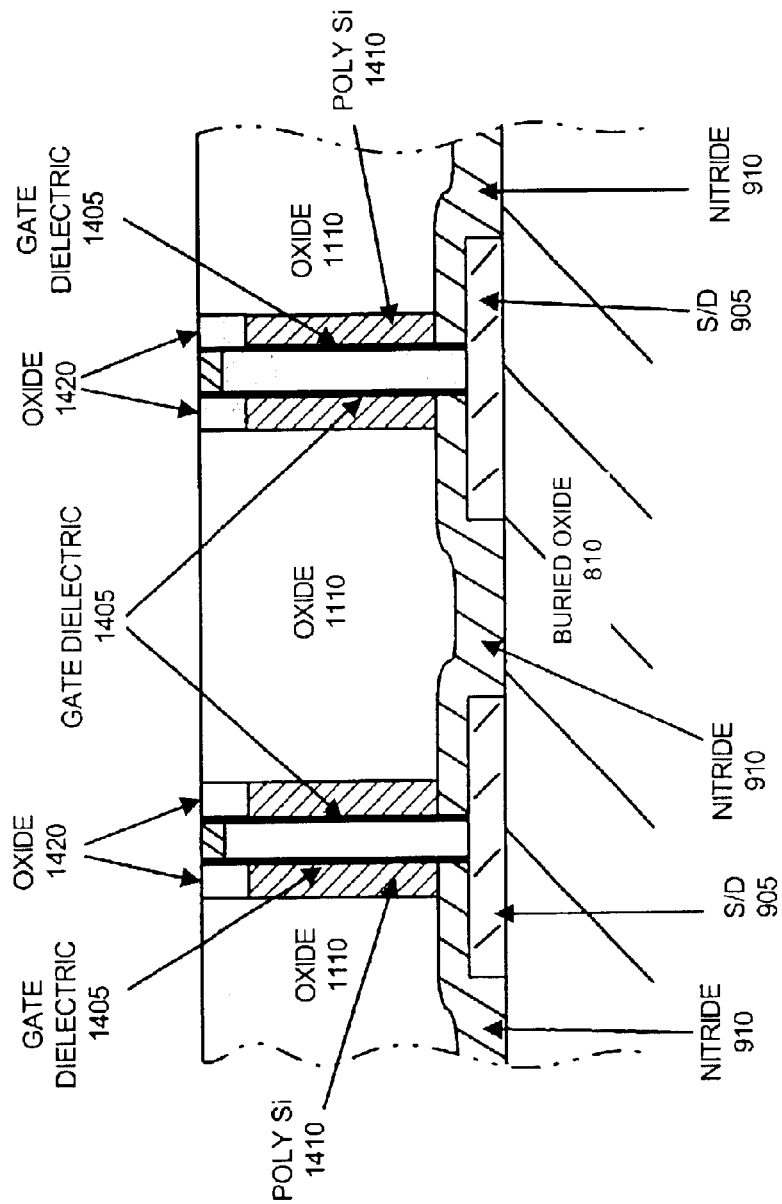
FIG. 14D illustrates the formation of oxide within the recessed region of FIGS. 14C consistent with the invention.

As shown in FIG. 14C, a portion of polysilicon 1410, to a depth d below the upper surface of oxide layer 1110, may be etched away to create a recessed region 1415. The portion may be etched, for example, in a chemistry selective to oxide, such as, for example, HBr. Depth d may range from approximately 100 Å to about 250 Å below the upper surface of oxide 1110. As further shown in FIG. 14D, recessed region 1415 over polysilicon 1410 maybe filled with about 500 Å–700 Å of oxide 1420 and then planarized.

Figure 15:
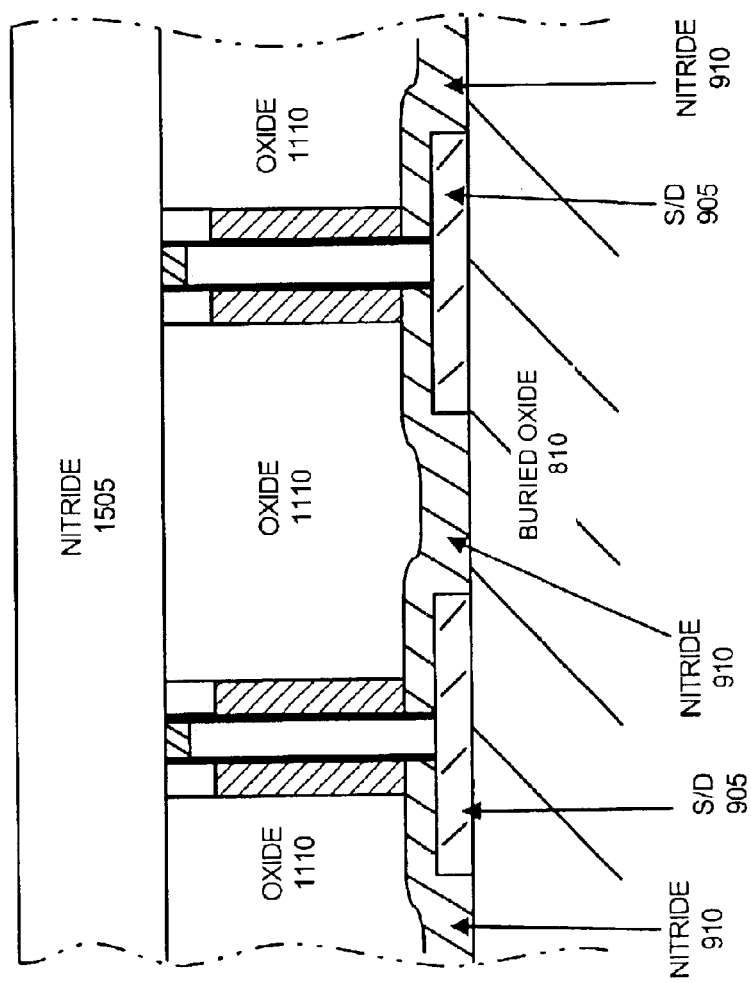
FIG. 15 illustrates exemplary nitride layer formation consistent with the invention.
Figures 16A, 16B:
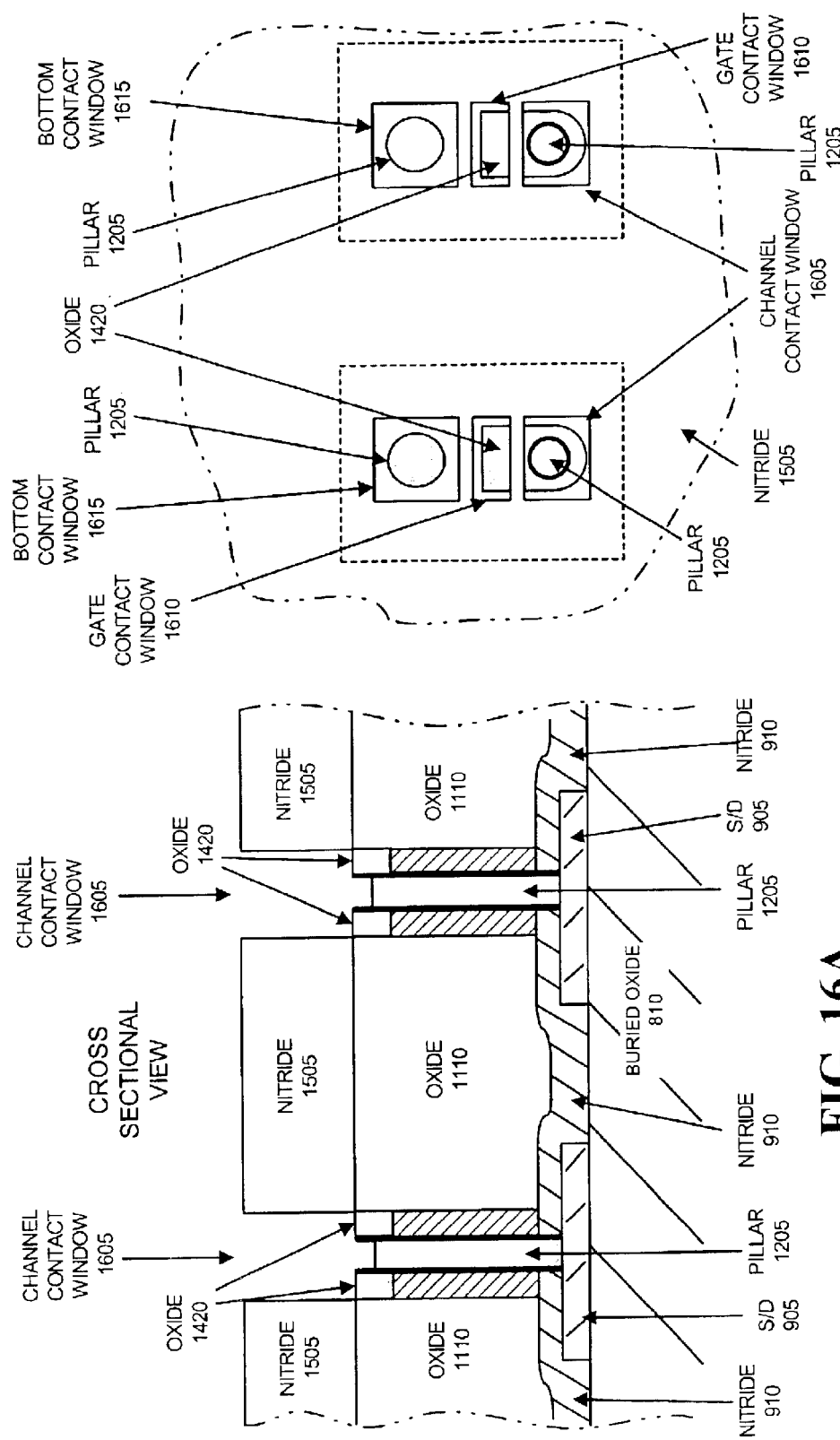
FIGS. 16A and 16B illustrate the exemplary formation of contact windows down to the oxide layer of FIG. 15 consistent with the invention.
Figure 16D:
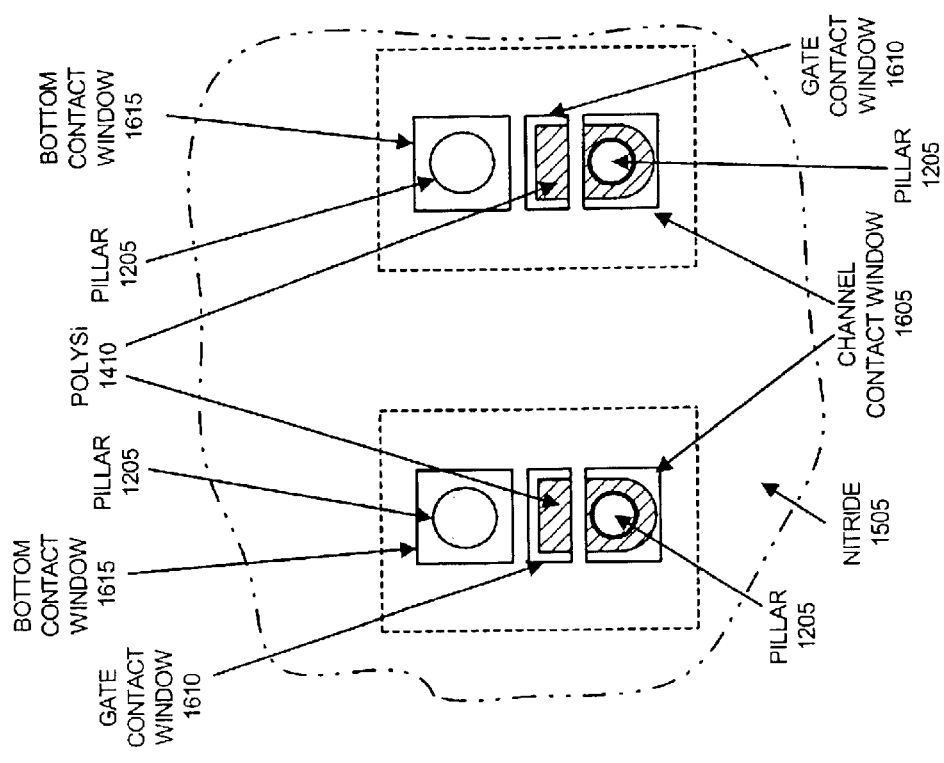
FIGS. 16C and 16D illustrate the exemplary removal of the oxide over the polysilicon of FIGS. 16A and 16B consistent with the invention.
Figure 16C:
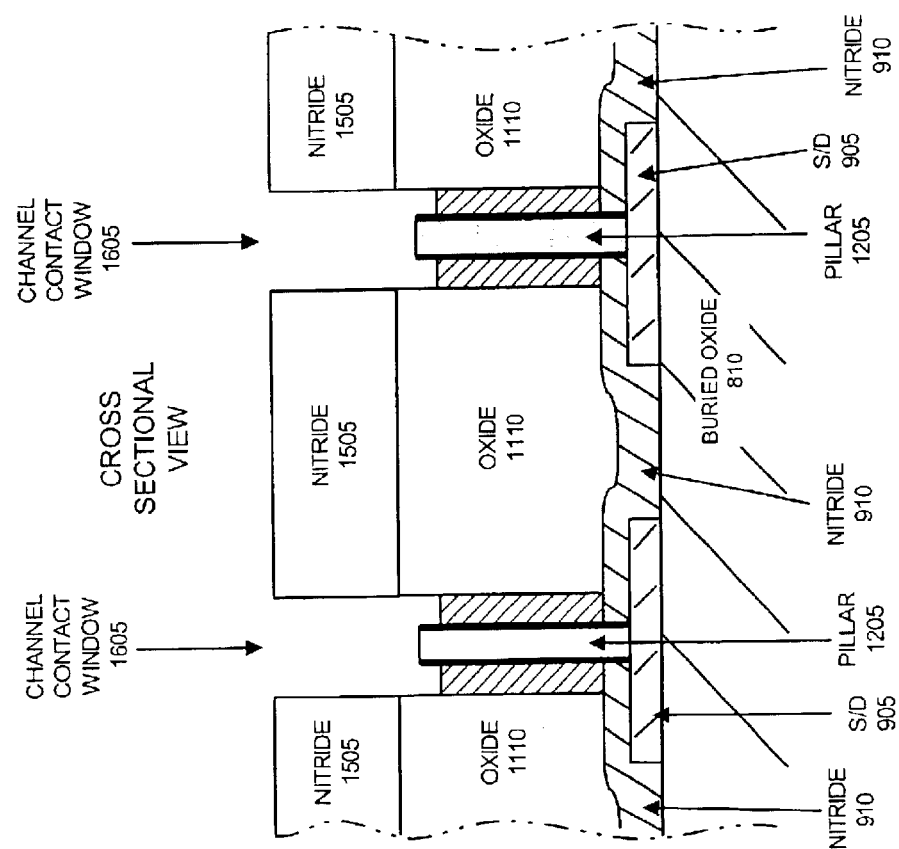

A layer of material, such as, for example, a nitride layer 1505, may then be formed on oxide 1110, as shown in FIG. 15. Nitride layer 1505 may be formed, for example, using existing deposition and planarization processes. The thickness of nitride layer 1505 may range, for example, from about 500 Å to about 1000 Å. As shown in FIGS. 16A and 16B, three different windows, channel contact window 1605, gate contact window 1610 and bottom contact window 1615, may be formed in nitride layer 1505 so that contacts may eventually be formed to contact the source/drain, channel and gate. Contact windows 1605, 1610 and 1615 may be formed using, for example, conventional etching processes to etch contact windows 1605, 1610 and 1615 through nitride layer 1505 down to an upper level of oxide 1110. As further shown in FIGS. 16C and 16D, oxide 1420 may be etched within gate contact window 1610 and channel contact window 1605 to expose the underlying polysilicon 1410. A separate mask may be used to remove oxide 1420 over polysilicon 1410 only within channel contact window 1605 and gate contact window 1610.

Bottom contact window 1615 may permit a contact to be formed to the larger of the pillars 1205 that serves as a low resistance contact to the underlying S/D region 905. Gate contact window 1610 may permit a contact to be formed with polysilicon 1410 that comprises the gate. Channel contact window 1605 may permit a contact to be formed to the smaller of the pillars 1205 that comprise the channel. Silicide materials, such as, for example, CoSi, NiSi and WsiX, and contact layers, such as, for example, Ti, TiN and W, may be put down in windows 1605, 1610 and 1615 to provide electrical contacts to the source/drain, gate and channel. With formation of the silicide materials and contact layers within windows 1605, 1610 and 1615, a gate all round vertical FinFET transistor may be formed with excellent control of channel dimensions.

Exemplary Thin Fin Finfet

Figures 17A, 17B:
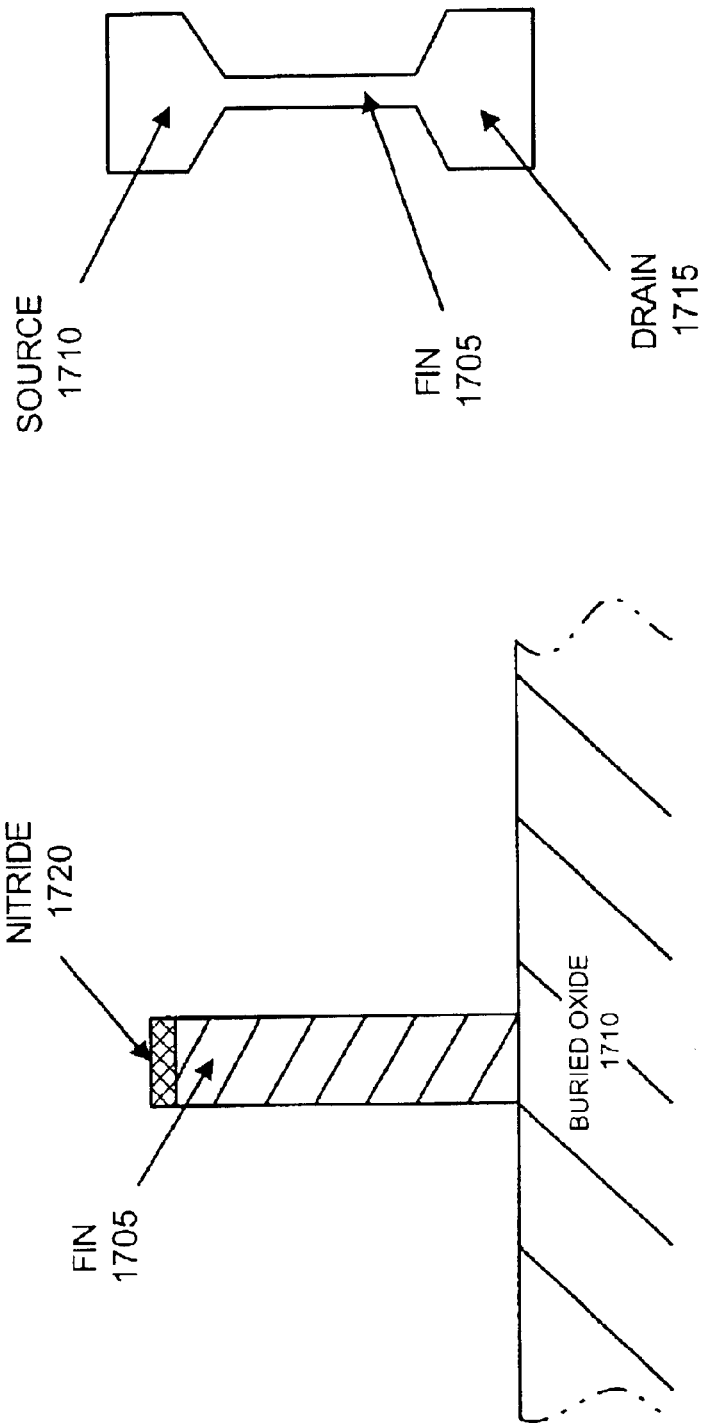
FIGS. 17A and 17B illustrate an exemplary fin, source and drain formed on buried oxide consistent with another exemplary embodiment of the invention.

In another exemplary embodiment of the invention, a thinner fin for a FinFET can be produced that reduces source/drain parasitics. In this exemplary embodiment, a fin 1705, source 1710 and drain 1715 may be formed on a buried oxide layer 1710, as shown in FIGS. 17A and 17B. Fin 1705, source 1710 and drain 1715 may include, for example, silicon, but other materials may be used. Fin 1505, source 1510 and drain 1515 may be formed using any conventional technique. A layer of material, such as, for example, a nitride layer 1720 may be formed upon 1705, source 1710 and drain 1715. The thickness of layer 1720 may range, for example, from about 200 Å to about 600 Å.

Figure 18:
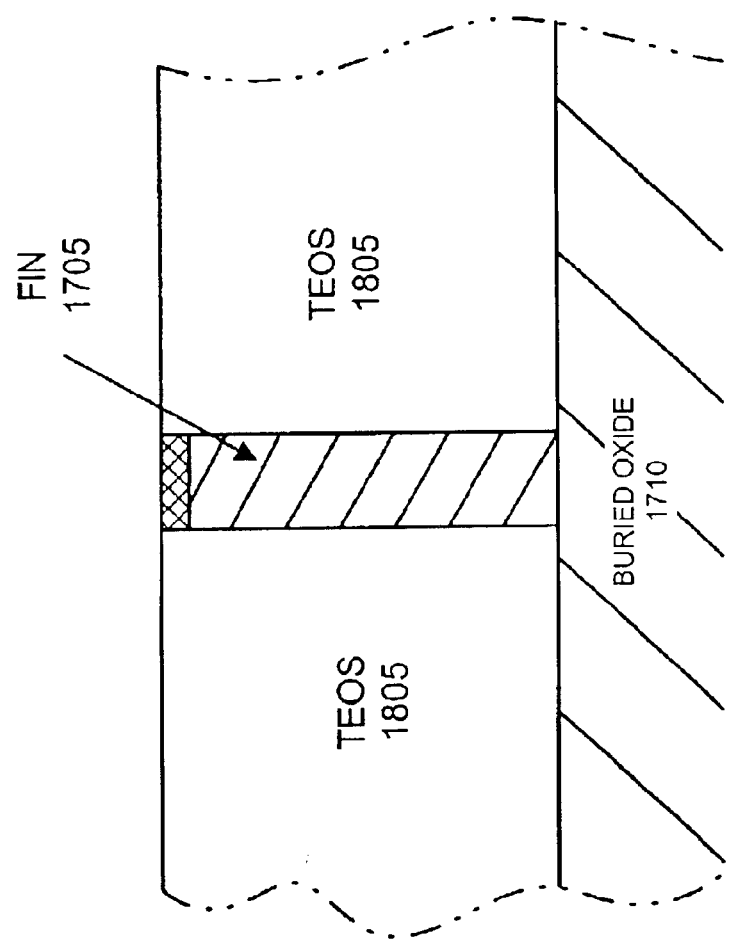
FIG. 18 illustrates a cross sectional view of the formation of a layer of tetraethylorthosilicate (TEOS) upon the buried oxide of FIG. 17A consistent with the invention.
Figure 19:
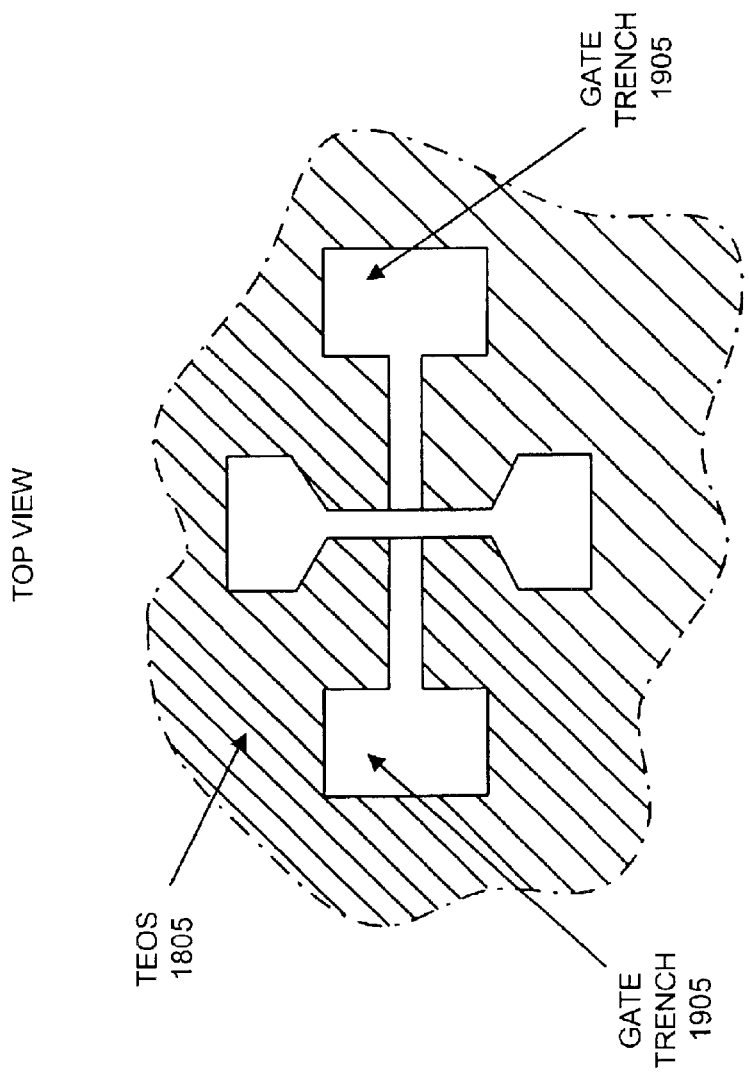
FIG. 19 illustrates a the formation of a gate trench in the TEOS of FIG. 18 consistent with the invention.
Figure 21B:
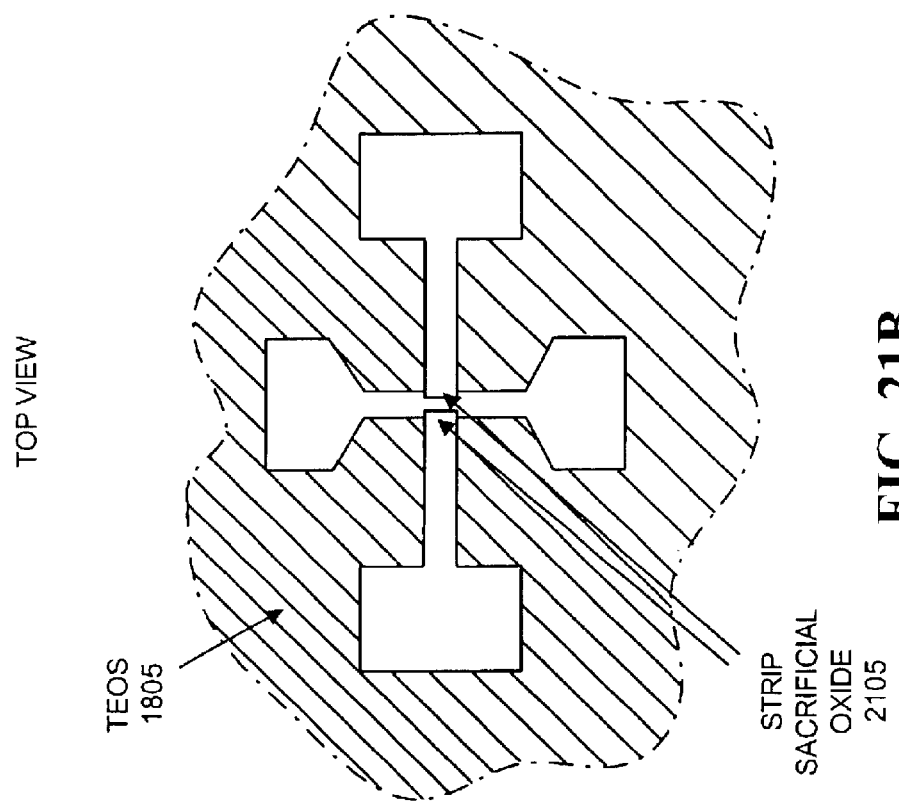
FIGS. 21A and 21B illustrate removal of the sacrificial oxide of FIGS. 20A and 20B consistent with the invention.
Figure 21A:
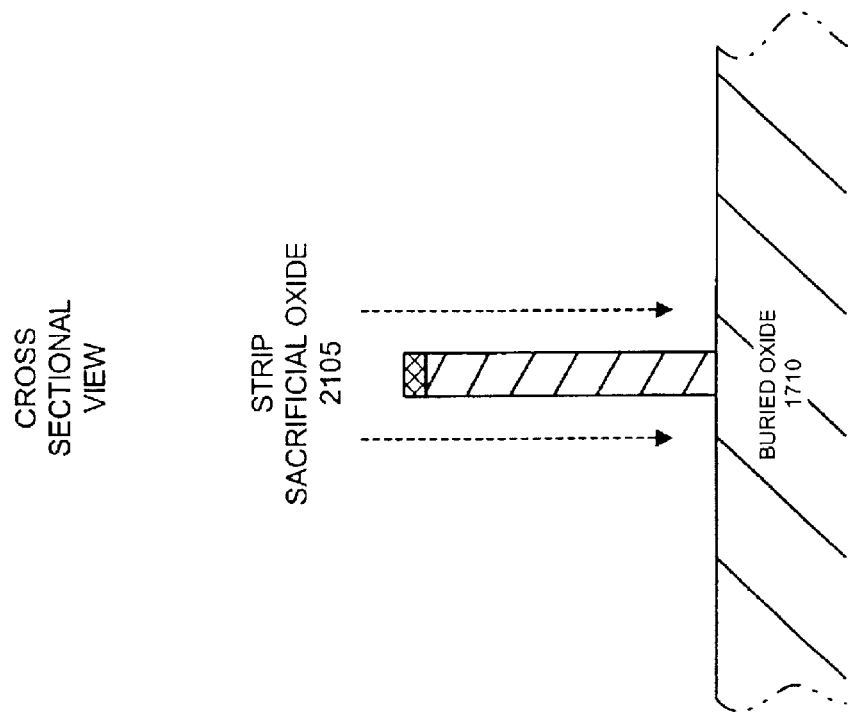

As shown in FIG. 18, a layer of tetraethylorthosilicate (TEOS) 1805 may then be deposited around fin 1705 and then planarized. A gate trench 1905 may then be opened in TEOS 1805 to the desired gate dimensions, as shown in FIG. 19, exposing portions of the sidewalls of fin 1705. As shown in FIGS. 20A and 20B, approximately 20–50 Å of sacrificial oxide 2005 (e.g., $SiO_2$) may the grown on the sidewalls of fin 1705 within gate trench 1905. For x Å of sacrificial oxide grown, approximately 0.5x Å of the silicon of fin 1705 may be consumed in forming the sacrificial oxide. Fin 1705, thus, becomes laterally thinner in the portion of fin 1705 exposed within gate trench 1905. Thinning fin 1705 in the region of the gate serves to reduce source/drain parasitics in the eventual resulting FinFET device. As shown in FIGS. 21A and 21B, sacrificial oxide maybe stripped 2105 using, for example, a HF process. In one implementation consistent with the invention, TEOS layer 1805 may be thermally densified, prior to formation of sacrificial oxide 2005, to prevent significant loss associated with the stripping of sacrificial oxide 2005, as shown in FIGS. 21A and 21B.

Figure 22B:
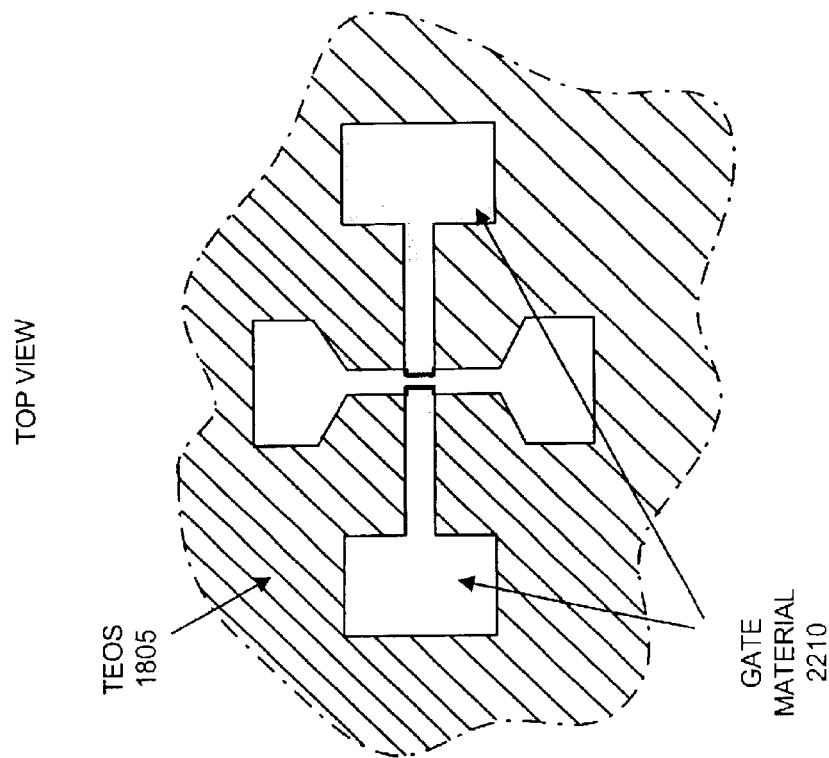
FIGS. 22A and 22B illustrate formation of a gate dielectric and gate consistent with the invention.
Figure 22A:
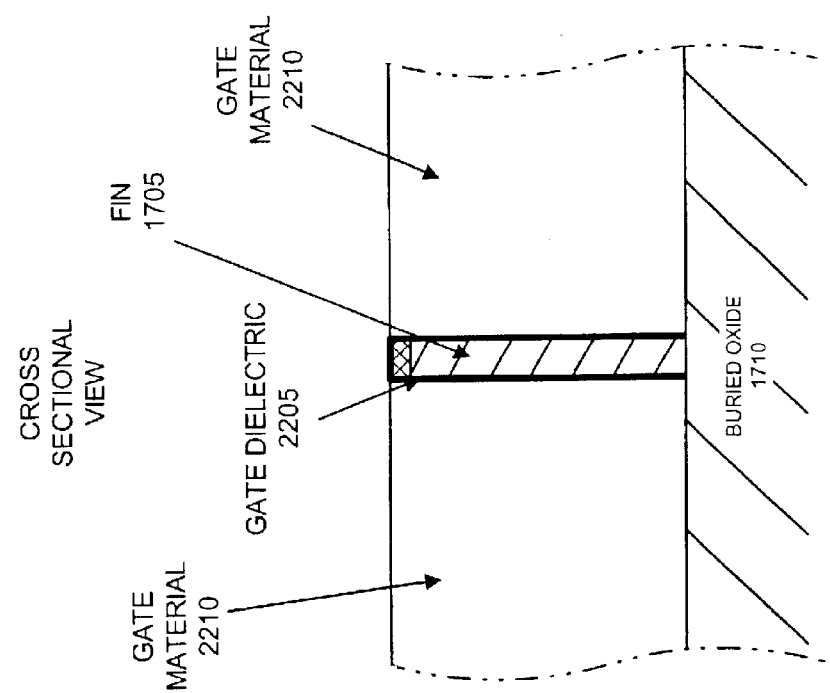

A gate dielectric 2205, such as, for example, an oxide material, may then be formed on fin 1705, as shown in FIGS. 22A and 22B. Gate dielectric may be formed using conventional growth or deposition processes. The thickness of gate dielectric 2205 may range, for example, from about 10 Å to about 50 Å. Gate trench 1905 may then be filled with a gate material 2210, such as, for example, polysilicon.

Figure 23:
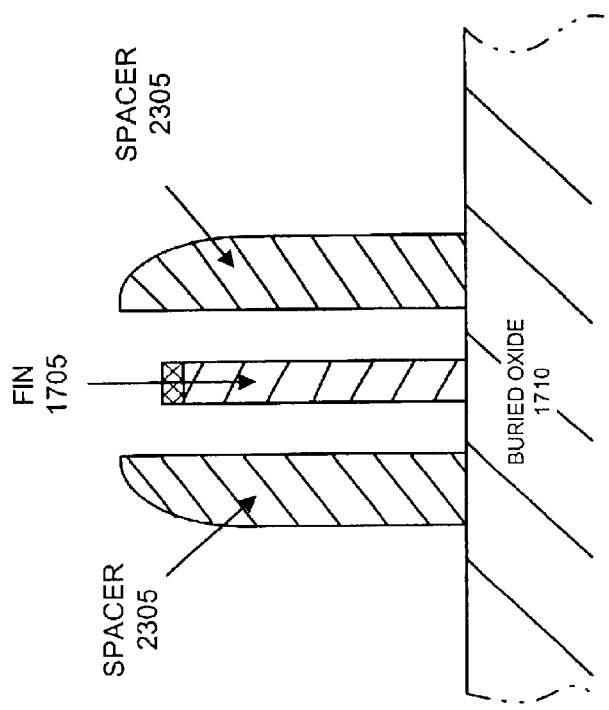
FIG. 23 illustrates formation of a spacer over the fin and sacrificial oxide of FIG. 20A.
Figure 24:
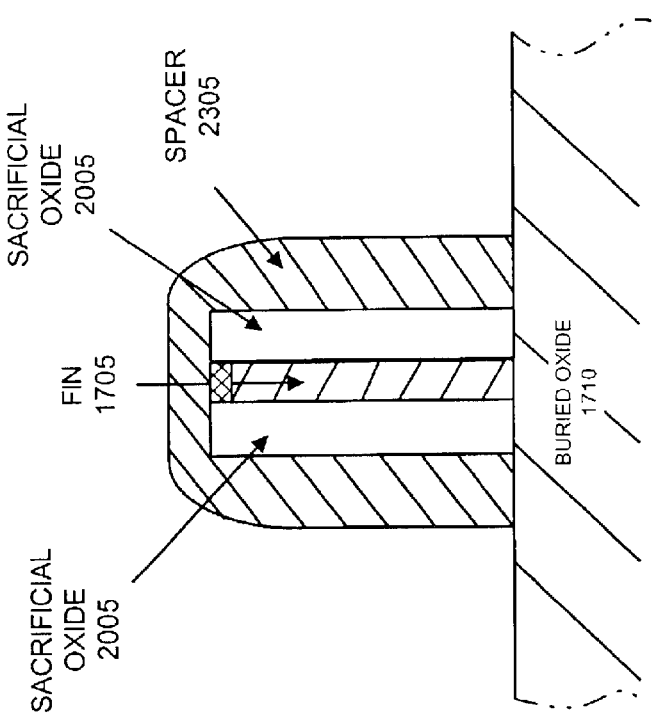
FIG. 24 illustrates removal of the sacrificial oxide of FIG. 23 consistent with the invention.

Alternatively, subsequent to growth of the sacrificial oxide 2005 (e.g., FIG. 20A), a nitride layer may be formed on sacrificial oxide 2005 and fin 1705 to form a spacer 2305, as shown in FIG. 23. As further shown in FIG. 24, a portion of spacer 2305 on top of fin 1705 may be removed, followed by the removal of sacrificial oxide 2005. Sacrificial oxide 2005 may be removed using, for example, existing etching processes that are selective to nitride.

Figure 25:
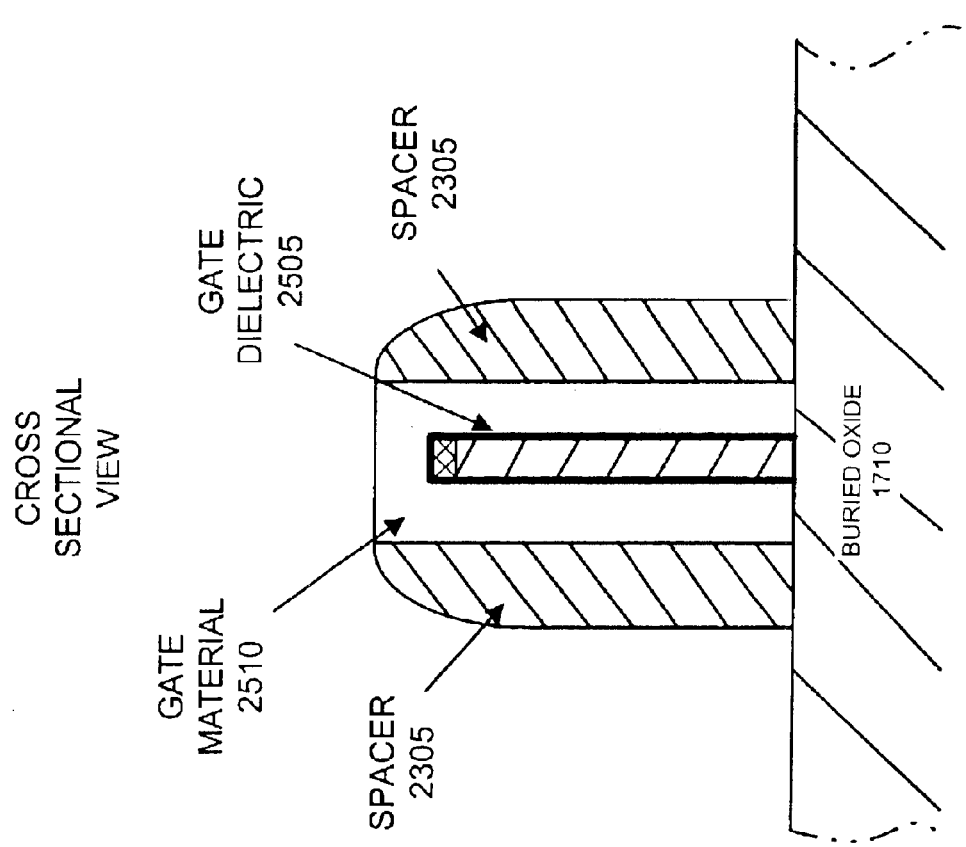
FIG. 25 illustrates a cross sectional view of the formation of a gate dielectric and gate over the fin, source and drain of FIG. 24 consistent with the invention.

As shown in FIG. 25, a gate dielectric 2505 may then be formed upon fin 1705 that includes, for example, an oxide material. The thickness of gate dielectric 2505 may range, for example, from about 10 Å to about 50 Å. Gate dielectric 2505 may be, for example, thermally grown upon fin 1705. Gate material 2510 may then be filled in the regions between fin 1505 and spacer 2305 created by removal of sacrificial oxide 2005. Gate material 2510 may include, for example, polysilicon, a metal, or a combination.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic and etching techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a gate electrode for a fin field effect transistor (FinFET), comprising:

forming a fin on a substrate;

forming an oxide layer over the fin;

forming a trench in the oxide layer, the trench crossing over the fin; and filling the trench with a material to form a gate electrode.

2. The method of claim 1, further comprising:

forming a layer of anti-reflective coating (ARC) on the oxide layer.

3. The method of claim 2, further comprising:

depositing and patterning a layer of photo-resist material over the anti-reflective coating.

4. The method of claim 3, further comprising:

etching away at least a portion of the oxide layer to form a protrusion above the fin.

5. The method of claim 4, further comprising:

forming a second nitride layer on the oxide layer.

6. The method of claim 5, further comprising:

polishing the nitride layer to remove at least a portion of the protrusion and expose a top surface of the protrusion.

7. The method of claim 6, further comprising:

etching the protrusion and the oxide layer to form the trench.

8. The method of claim 7, further comprising:

removing the second nitride layer.

9. The method of claim 8, further comprising:

forming a dielectric layer over the fin within the trench.

10. The method of claim 9, wherein filling the trench with the material further comprises:

depositing at least one of a polysilicon and a metal material to form the gate electrode.

11. The method of claim 10, further comprising;

planarizing the deposited material.

12. The method of claim 1, further comprising:

forming a first nitride layer over the fin before forming the oxide layer over the fin.

13. A method of forming a gate for a fin field effect transistor (FinFET), comprising:

forming an oxide layer over a fin;

etching away at least a portion of the oxide layer to form a protrusion above the fin;

forming a nitride layer over the oxide layer and the protrusion;

polishing the nitride layer and the protrusion to expose a top surface of the protrusion;

etching the protrusion and the oxide layer to form a trench that crosses over the fin; and filling the trench with a material to form the gate.

14. The method of claim 13, wherein the material comprises at least one of polysilicon and metal.

15. The method of claim 13, wherein the fin comprises silicon.

16. The method of claim 15, wherein etching the protrusion and the oxide layer comprises:

etching selective to silicon.

17. The method of claim 15, wherein the trench crosses over the fin transverse to the fin.

18. The method of claim 15, further comprising:

forming an anti-reflective coating over the oxide layer prior to etching away at least a portion of the oxide layer to form the protrusion.

19. The method of claim 18, wherein etching away at least a portion of the oxide layer further comprises:

depositing and patterning a layer of photo-resist material over the anti-reflective coating.

* * * * *